US011417605B2

(12) United States Patent
See et al.

(10) Patent No.: US 11,417,605 B2
(45) Date of Patent: Aug. 16, 2022

(54) RECONSTITUTED SUBSTRATE FOR RADIO FREQUENCY APPLICATIONS

(71) Applicant: Applied Materials, Inc., Santa Clara, CA (US)

(72) Inventors: Guan Huei See, Singapore (SG); Ramesh Chidambaram, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 16/841,766

(22) Filed: Apr. 7, 2020

(65) Prior Publication Data

US 2020/0358163 A1 Nov. 12, 2020

(51) Int. Cl.
*H01Q 1/24* (2006.01)
*H01L 23/538* (2006.01)
(Continued)

(52) U.S. Cl.
CPC ........ *H01L 23/5389* (2013.01); *H01L 21/486* (2013.01); *H01L 21/4864* (2013.01); *H01L 21/50* (2013.01); *H01L 21/76802* (2013.01); *H01L 23/13* (2013.01); *H01L 23/147* (2013.01); *H01L 23/49827* (2013.01); *H01L 23/49838* (2013.01); *H01L 23/49866* (2013.01); *H01L 23/49894* (2013.01); *H01L 23/5384* (2013.01); *H01L 23/5385* (2013.01);
(Continued)

(58) Field of Classification Search
None
See application file for complete search history.

(56) References Cited

U.S. PATENT DOCUMENTS 4,073,610 A 2/1978 Cox
5,126,016 A 6/1992 Glenning et al.
(Continued)

FOREIGN PATENT DOCUMENTS

CA 2481616 C 1/2013
CN 1971894 A 5/2007
(Continued)

OTHER PUBLICATIONS

Baier, T. et al., Theoretical Approach to Estimate Laser Process Parameters for Drilling in Crystalline Silicon, Prog. Photovolt: Res. Appl. 18 (2010) 603-606, 5 pages.
(Continued)

*Primary Examiner* — Long Pham
(74) *Attorney, Agent, or Firm* — Patterson + Sheridan LLP

(57) ABSTRACT

The present disclosure relates to methods and apparatus for forming thin-form-factor reconstituted substrates and semiconductor device packages for radio frequency applications. The substrate and package structures described herein may be utilized in high-density 2D and 3D integrated devices for 4G, 5G, 6G, and other wireless network systems. In one embodiment, a silicon substrate is structured by laser ablation to include cavities for placement of semiconductor dies and vias for deposition of conductive interconnections. Additionally, one or more cavities are structured to be filled or occupied with a flowable dielectric material. Integration of one or more radio frequency components adjacent the dielectric-filled cavities enables improved performance of the radio frequency elements with reduced signal loss caused by the silicon substrate.

20 Claims, 24 Drawing Sheets

(51) Int. Cl.

| | |
|---|---|
| ***H01L 21/48*** | (2006.01) |
| ***H01L 23/13*** | (2006.01) |
| ***H01L 23/14*** | (2006.01) |
| ***H01L 23/498*** | (2006.01) |
| ***H01L 25/10*** | (2006.01) |
| ***H01L 23/66*** | (2006.01) |
| ***H01Q 1/22*** | (2006.01) |
| ***H05K 1/02*** | (2006.01) |
| ***H01L 21/50*** | (2006.01) |
| ***H01L 21/768*** | (2006.01) |
| ***H01L 25/065*** | (2006.01) |
| ***H01L 27/06*** | (2006.01) |
| *H01L 21/60* | (2006.01) |

(52) U.S. Cl.

CPC .......... *H01L 23/5386* (2013.01); *H01L 23/66* (2013.01); *H01L 25/0657* (2013.01); *H01L 25/105* (2013.01); *H01L 27/0688* (2013.01); *H01Q 1/2283* (2013.01); *H01Q 1/243* (2013.01); *H05K 1/0243* (2013.01); *H01L 2021/60007* (2013.01); *H01L 2225/107* (2013.01); *H01L 2225/1035* (2013.01)

(56) References Cited

U.S. PATENT DOCUMENTS

| | | | |
|---|---|---|---|
| 5,268,194 | A | 12/1993 | Kawakami et al. |
| 5,353,195 | A | 10/1994 | Fillion et al. |
| 5,367,143 | A | 11/1994 | White, Jr. |
| 5,374,788 | A | 12/1994 | Endoh et al. |
| 5,474,834 | A | 12/1995 | Tanahashi et al. |
| 5,670,262 | A | 9/1997 | Dalman |
| 5,767,480 | A | 6/1998 | Anglin et al. |
| 5,783,870 | A | 7/1998 | Mostafazadeh et al. |
| 5,841,102 | A | 11/1998 | Noddin |
| 5,878,485 | A | 3/1999 | Wood et al. |
| 6,039,889 | A | 3/2000 | Zhang et al. |
| 6,087,719 | A | 7/2000 | Tsunashima |
| 6,117,704 | A | 9/2000 | Yamaguchi et al. |
| 6,211,485 | B1 | 4/2001 | Burgess |
| 6,384,473 | B1 | 5/2002 | Peterson et al. |
| 6,388,202 | B1 | 5/2002 | Swirbel et al. |
| 6,388,207 | B1 | 5/2002 | Figueroa et al. |
| 6,459,046 | B1 | 10/2002 | Ochi et al. |
| 6,465,084 | B1 | 10/2002 | Curcio et al. |
| 6,489,670 | B1 | 12/2002 | Peterson et al. |
| 6,495,895 | B1 | 12/2002 | Peterson et al. |
| 6,506,632 | B1 | 1/2003 | Cheng et al. |
| 6,512,182 | B2 | 1/2003 | Takeuchi et al. |
| 6,538,312 | B1 | 3/2003 | Peterson et al. |
| 6,555,906 | B2 | 4/2003 | Towle et al. |
| 6,576,869 | B1 | 6/2003 | Gower et al. |
| 6,593,240 | B1 | 7/2003 | Page |
| 6,631,558 | B2 | 10/2003 | Burgess |
| 6,661,084 | B1 | 12/2003 | Peterson et al. |
| 6,713,719 | B1 | 3/2004 | De Steur et al. |
| 6,724,638 | B1 | 4/2004 | Inagaki et al. |
| 6,775,907 | B1 | 8/2004 | Boyko et al. |
| 6,781,093 | B2 | 8/2004 | Conlon et al. |
| 6,799,369 | B2 | 10/2004 | Ochi et al. |
| 6,894,399 | B2 | 5/2005 | Vu et al. |
| 7,028,400 | B1 | 4/2006 | Hiner et al. |
| 7,062,845 | B2 | 6/2006 | Burgess |
| 7,064,069 | B2 | 6/2006 | Draney et al. |
| 7,078,788 | B2 | 7/2006 | Vu et al. |
| 7,091,589 | B2 | 8/2006 | Mori et al. |
| 7,091,593 | B2 | 8/2006 | Ishimaru et al. |
| 7,105,931 | B2 | 9/2006 | Attarwala |
| 7,129,117 | B2 | 10/2006 | Hsu |
| 7,166,914 | B2 | 1/2007 | DiStefano et al. |
| 7,170,152 | B2 | 1/2007 | Huang et al. |
| 7,192,807 | B1 | 3/2007 | Huemoeller et al. |
| 7,211,899 | B2 | 5/2007 | Taniguchi et al. |
| 7,271,012 | B2 | 9/2007 | Anderson |
| 7,274,099 | B2 | 9/2007 | Hsu |
| 7,276,446 | B2 | 10/2007 | Robinson et al. |
| 7,279,357 | B2 | 10/2007 | Shimoishizaka et al. |
| 7,312,405 | B2 | 12/2007 | Hsu |
| 7,321,164 | B2 | 1/2008 | Hsu |
| 7,449,363 | B2 | 11/2008 | Hsu |
| 7,458,794 | B2 | 12/2008 | Schwaighofer et al. |
| 7,511,365 | B2 | 3/2009 | Wu et al. |
| 7,690,109 | B2 | 4/2010 | Mori et al. |
| 7,714,431 | B1 | 5/2010 | Huemoeller et al. |
| 7,723,838 | B2 | 5/2010 | Takeuchi et al. |
| 7,754,530 | B2 | 7/2010 | Wu et al. |
| 7,808,799 | B2 | 10/2010 | Kawabe et al. |
| 7,839,649 | B2 | 11/2010 | Hsu |
| 7,843,064 | B2 | 11/2010 | Kuo et al. |
| 7,852,634 | B2 | 12/2010 | Sakamoto et al. |
| 7,855,460 | B2 | 12/2010 | Kuwajima |
| 7,868,464 | B2 | 1/2011 | Kawabata et al. |
| 7,887,712 | B2 | 2/2011 | Boyle et al. |
| 7,914,693 | B2 | 3/2011 | Jeong et al. |
| 7,915,737 | B2 | 3/2011 | Nakasato et al. |
| 7,932,595 | B1 | 4/2011 | Huemoeller et al. |
| 7,932,608 | B2 | 4/2011 | Tseng et al. |
| 7,955,942 | B2 | 6/2011 | Pagaila et al. |
| 7,978,478 | B2 | 7/2011 | Inagaki et al. |
| 7,982,305 | B1 | 7/2011 | Railkar et al. |
| 7,988,446 | B2 | 8/2011 | Yeh et al. |
| 8,069,560 | B2 | 12/2011 | Mori et al. |
| 8,137,497 | B2 | 3/2012 | Sunohara et al. |
| 8,283,778 | B2 | 10/2012 | Trezza |
| 8,314,343 | B2 | 11/2012 | Inoue et al. |
| 8,367,943 | B2 | 2/2013 | Wu et al. |
| 8,384,203 | B2 | 2/2013 | Toh et al. |
| 8,390,125 | B2 | 3/2013 | Tseng et al. |
| 8,426,246 | B2 | 4/2013 | Toh et al. |
| 8,476,769 | B2 | 7/2013 | Chen et al. |
| 8,518,746 | B2 | 8/2013 | Pagaila et al. |
| 8,536,695 | B2 | 9/2013 | Liu et al. |
| 8,628,383 | B2 | 1/2014 | Starling et al. |
| 8,633,397 | B2 | 1/2014 | Jeong et al. |
| 8,698,293 | B2 | 4/2014 | Otremba et al. |
| 8,704,359 | B2 | 4/2014 | Tuominen et al. |
| 8,710,402 | B2 | 4/2014 | Lei et al. |
| 8,710,649 | B1 | 4/2014 | Huemoeller et al. |
| 8,728,341 | B2 | 5/2014 | Ryuzaki et al. |
| 8,772,087 | B2 | 7/2014 | Barth et al. |
| 8,786,098 | B2 | 7/2014 | Wang |
| 8,877,554 | B2 | 11/2014 | Tsai et al. |
| 8,890,628 | B2 | 11/2014 | Nair et al. |
| 8,907,471 | B2 | 12/2014 | Beyne et al. |
| 8,921,995 | B1 | 12/2014 | Railkar et al. |
| 8,952,544 | B2 | 2/2015 | Lin et al. |
| 8,980,691 | B2 | 3/2015 | Lin |
| 8,990,754 | B2 | 3/2015 | Bird et al. |
| 8,994,185 | B2 | 3/2015 | Lin et al. |
| 8,999,759 | B2 | 4/2015 | Chia |
| 9,059,186 | B2 | 6/2015 | Shim et al. |
| 9,064,936 | B2 | 6/2015 | Lin et al. |
| 9,070,637 | B2 | 6/2015 | Yoda et al. |
| 9,099,313 | B2 | 8/2015 | Lee et al. |
| 9,111,914 | B2 | 8/2015 | Lin et al. |
| 9,142,487 | B2 | 9/2015 | Toh et al. |
| 9,159,678 | B2 | 10/2015 | Cheng et al. |
| 9,161,453 | B2 | 10/2015 | Koyanagi |
| 9,210,809 | B2 | 12/2015 | Mallik et al. |
| 9,224,674 | B2 | 12/2015 | Malatkar et al. |
| 9,275,934 | B2 | 3/2016 | Sundaram et al. |
| 9,318,376 | B1 | 4/2016 | Holm et al. |
| 9,355,881 | B2 | 5/2016 | Goller et al. |
| 9,363,898 | B2 | 6/2016 | Tuominen et al. |
| 9,396,999 | B2 | 7/2016 | Yap et al. |
| 9,406,645 | B1 | 8/2016 | Huemoeller et al. |
| 9,499,397 | B2 | 11/2016 | Bowles et al. |
| 9,530,752 | B2 | 12/2016 | Nikitin et al. |
| 9,554,469 | B2 | 1/2017 | Hurwitz et al. |
| 9,660,037 | B1 | 5/2017 | Zechmann et al. |
| 9,698,104 | B2 | 7/2017 | Yap et al. |
| 9,704,726 | B2 | 7/2017 | Toh et al. |

(56) References Cited

U.S. PATENT DOCUMENTS 9,735,134 B2 8/2017 Chen
9,748,167 B1 8/2017 Lin
9,754,849 B2 9/2017 Huang et al.
9,837,352 B2 12/2017 Chang et al.
9,837,484 B2 12/2017 Jung et al.
9,859,258 B2 1/2018 Chen et al.
9,875,970 B2 1/2018 Yi et al.
9,887,103 B2 2/2018 Scanlan et al.
9,887,167 B1 2/2018 Lee et al.
9,893,045 B2 2/2018 Pagaila et al.
9,978,720 B2 5/2018 Theuss et al.
9,997,444 B2 6/2018 Meyer et al.
10,014,292 B2 7/2018 Or-Bach et al.
10,037,975 B2 7/2018 Hsieh et al.
10,053,359 B2 8/2018 Bowles et al.
10,090,284 B2 10/2018 Chen et al.
10,109,588 B2 10/2018 Jeong et al.
10,128,177 B2 11/2018 Kamgaing et al.
10,153,219 B2 12/2018 Jeon et al.
10,163,803 B1 12/2018 Chen et al.
10,170,386 B2 1/2019 Kang et al.
10,177,083 B2 1/2019 Kim et al.
10,211,072 B2 2/2019 Chen et al.
10,229,827 B2 3/2019 Chen et al.
10,256,180 B2 4/2019 Liu et al.
10,269,773 B1 4/2019 Yu et al.
10,297,518 B2 5/2019 Lin et al.
10,297,586 B2 5/2019 Or-Bach et al.
10,304,765 B2 5/2019 Chen et al.
10,347,585 B2 7/2019 Shin et al.
10,410,971 B2 9/2019 Rae et al.
10,424,530 B1 9/2019 Alur et al.
10,515,912 B2 12/2019 Lim et al.
10,522,483 B2 12/2019 Shuto
10,553,515 B2 2/2020 Chew
10,570,257 B2 2/2020 Sun et al.
10,658,337 B2 5/2020 Yu et al.
2001/0020548 A1 9/2001 Burgess
2001/0030059 A1 10/2001 Sugaya et al.
2002/0036054 A1 3/2002 Nakatani et al.
2002/0048715 A1 4/2002 Walczynski
2002/0070443 A1 6/2002 Mu et al.
2002/0074615 A1 6/2002 Honda
2002/0135058 A1 9/2002 Asahi et al.
2002/0158334 A1 10/2002 Vu et al.
2002/0170891 A1 11/2002 Boyle et al.
2003/0059976 A1 3/2003 Nathan et al.
2003/0221864 A1 12/2003 Bergstedt et al.
2003/0222330 A1 12/2003 Sun et al.
2004/0080040 A1 4/2004 Dotta et al.
2004/0118824 A1 6/2004 Burgess
2004/0134682 A1 7/2004 En et al.
2004/0248412 A1 12/2004 Liu et al.
2005/0012217 A1 1/2005 Mori et al.
2005/0170292 A1 8/2005 Tsai et al.
2006/0014532 A1 1/2006 Seligmann et al.
2006/0073234 A1 4/2006 Williams
2006/0128069 A1 6/2006 Hsu
2006/0145328 A1 7/2006 Hsu
2006/0160332 A1 7/2006 Gu et al.
2006/0270242 A1 11/2006 Verhaverbeke et al.
2006/0283716 A1 12/2006 Hafez et al.
2007/0035033 A1 2/2007 Ozguz et al.
2007/0042563 A1 2/2007 Wang et al.
2007/0077865 A1 4/2007 Dysard et al.
2007/0111401 A1 5/2007 Kataoka et al.
2007/0130761 A1 6/2007 Kang et al.
2008/0006945 A1 1/2008 Lin et al.
2008/0011852 A1 1/2008 Gu et al.
2008/0090095 A1 4/2008 Nagata et al.
2008/0113283 A1 5/2008 Ghoshal et al.
2008/0119041 A1 5/2008 Magera et al.
2008/0173792 A1 7/2008 Yang et al.
2008/0173999 A1 7/2008 Chung et al.
2008/0296273 A1 12/2008 Lei et al.
2009/0084596 A1 4/2009 Inoue et al.
2009/0243065 A1 10/2009 Sugino et al.
2009/0250823 A1 10/2009 Racz et al.
2009/0278126 A1 11/2009 Yang et al.
2010/0013081 A1 1/2010 Toh et al.
2010/0062287 A1 3/2010 Beresford et al.
2010/0144101 A1 6/2010 Chow et al.
2010/0148305 A1 6/2010 Yun
2010/0160170 A1 6/2010 Horimoto et al.
2010/0248451 A1 9/2010 Pirogovsky et al.
2010/0264538 A1 10/2010 Swinnen et al.
2010/0301023 A1 12/2010 Unrath et al.
2010/0307798 A1 12/2010 Izadian
2011/0062594 A1 3/2011 Maekawa et al.
2011/0097432 A1 4/2011 Yu et al.
2011/0111300 A1 5/2011 DelHagen et al.
2011/0204505 A1 8/2011 Pagaila et al.
2011/0259631 A1 10/2011 Rumsby
2011/0291293 A1 12/2011 Tuominen et al.
2011/0304024 A1 12/2011 Renna
2011/0316147 A1 12/2011 Shih et al.
2012/0128891 A1 5/2012 Takei et al.
2012/0146209 A1 6/2012 Hu et al.
2012/0164827 A1 6/2012 Rajagopalan et al.
2012/0261805 A1 10/2012 Sundaram et al.
2013/0074332 A1 3/2013 Suzuki
2013/0105329 A1 5/2013 Matejat et al.
2013/0196501 A1 8/2013 Sulfridge
2013/0203190 A1 8/2013 Reed et al.
2013/0286615 A1 10/2013 Inagaki et al.
2013/0341738 A1 12/2013 Reinmuth et al.
2014/0054075 A1 2/2014 Hu
2014/0092519 A1 4/2014 Yang
2014/0094094 A1 4/2014 Rizzuto et al.
2014/0103499 A1 4/2014 Andry et al.
2014/0252655 A1 9/2014 Tran et al.
2014/0353019 A1 12/2014 Arora et al.
2015/0228416 A1 8/2015 Hurwitz et al.
2015/0296610 A1 10/2015 Daghighian et al.
2015/0311093 A1 10/2015 Li et al.
2015/0359098 A1 12/2015 Ock
2015/0380356 A1 12/2015 Chauhan et al.
2016/0013135 A1 1/2016 He et al.
2016/0020163 A1 1/2016 Shimizu et al.
2016/0049371 A1 2/2016 Lee et al.
2016/0088729 A1 3/2016 Kobuke et al.
2016/0095203 A1 3/2016 Min et al.
2016/0118337 A1 4/2016 Yoon et al.
2016/0270242 A1 9/2016 Kim et al.
2016/0276325 A1 9/2016 Nair et al.
2016/0329299 A1 11/2016 Lin et al.
2016/0336296 A1 11/2016 Jeong et al.
2017/0047308 A1 2/2017 Ho et al.
2017/0064835 A1 3/2017 Ishihara et al.
2017/0223842 A1 8/2017 Chujo et al.
2017/0229432 A1 8/2017 Lin et al.
2017/0338254 A1 11/2017 Reit et al.
2018/0019197 A1 1/2018 Boyapati et al.
2018/0116057 A1 4/2018 Kajihara et al.
2018/0182727 A1 6/2018 Yu
2018/0197831 A1 7/2018 Kim et al.
2018/0204802 A1 7/2018 Lin et al.
2018/0205134 A1 7/2018 Khan et al.
2018/0308792 A1 10/2018 Raghunathan et al.
2018/0352658 A1 12/2018 Yang
2018/0374696 A1 12/2018 Chen et al.
2018/0376589 A1 12/2018 Harazono
2019/0088603 A1 3/2019 Marimuthu et al.
2019/0131224 A1 5/2019 Choi et al.
2019/0131270 A1 5/2019 Lee et al.
2019/0131284 A1 5/2019 Jeng et al.
2019/0189561 A1 6/2019 Rusli
2019/0229046 A1 7/2019 Tsai et al.
2019/0237430 A1 8/2019 England
2019/0285981 A1 9/2019 Cunningham et al.
2019/0306988 A1 10/2019 Grober et al.
2019/0355680 A1 11/2019 Chuang et al.
2019/0369321 A1 12/2019 Young et al.
2020/0003936 A1 1/2020 Fu et al.

(56) References Cited

U.S. PATENT DOCUMENTS

| | | | |
|---|---|---|---|
| 2020/0039002 A1 | 2/2020 | Sercel et al. |
| 2020/0130131 A1 | 4/2020 | Togawa et al. |
| 2020/0357947 A1 | 11/2020 | Chen et al. |
| 2020/0358163 A1 | 11/2020 | See et al. |

FOREIGN PATENT DOCUMENTS

| | | | |
|---|---|---|---|
| CN | 100463128 | C | 2/2009 |
| CN | 100502040 | C | 6/2009 |
| CN | 100524717 | C | 8/2009 |
| CN | 100561696 | C | 11/2009 |
| CN | 104637912 | A | 5/2015 |
| CN | 105436718 | A | 3/2016 |
| CN | 106531647 | A | 3/2017 |
| CN | 106653703 | A | 5/2017 |
| CN | 108028225 | A | 5/2018 |
| CN | 111492472 | A | 8/2020 |
| EP | 0264134 | A2 | 4/1988 |
| EP | 1536673 | A1 | 6/2005 |
| EP | 1478021 | B1 | 7/2008 |
| EP | 1845762 | B1 | 5/2011 |
| EP | 2942808 | A1 | 11/2015 |
| JP | 2001244591 | A | 9/2001 |
| JP | 2002246755 | A | 8/2002 |
| JP | 2003188340 | A | 7/2003 |
| JP | 2004311788 | A | 11/2004 |
| JP | 2004335641 | A | 11/2004 |
| JP | 4108285 | B2 | 6/2008 |
| JP | 2012069926 | A | 4/2012 |
| JP | 5004378 | B2 | 8/2012 |
| JP | 5111342 | B2 | 1/2013 |
| JP | 5693977 | B2 | 4/2015 |
| JP | 5700241 | B2 | 4/2015 |
| JP | 5981232 | B2 | 8/2016 |
| JP | 6394136 | B2 | 9/2018 |
| JP | 6542616 | B2 | 7/2019 |
| JP | 6626697 | B2 | 12/2019 |
| KR | 100714196 | B1 | 5/2007 |
| KR | 100731112 | B1 | 6/2007 |
| KR | 10-2008-0037296 | A | 4/2008 |
| KR | 2008052491 | A | 6/2008 |
| KR | 20100097893 | A | 9/2010 |
| KR | 101301507 | B1 | 9/2013 |
| KR | 20140086375 | A | 7/2014 |
| KR | 101494413 | B1 | 2/2015 |
| KR | 20160013706 | A | 2/2016 |
| KR | 20180113885 | A | 10/2018 |
| KR | 101922884 | B1 | 11/2018 |
| KR | 101975302 | B1 | 8/2019 |
| KR | 102012443 | B1 | 8/2019 |
| TW | I594397 | B | 8/2017 |
| WO | 2011130300 | A1 | 10/2011 |
| WO | 2013008415 | A1 | 1/2013 |
| WO | 2013126927 | A2 | 8/2013 |
| WO | 2015126438 | A1 | 8/2015 |
| WO | 2017111957 | A1 | 6/2017 |
| WO | 2018013122 | A1 | 1/2018 |
| WO | 2018125184 | A1 | 7/2018 |
| WO | 2019023213 | A1 | 1/2019 |
| WO | 2019066988 | A1 | 4/2019 |
| WO | 2019/177742 | A1 | 9/2019 |

OTHER PUBLICATIONS

International Search Report and the Written Opinion for International Application No. PCT/US2019/064280 dated Mar. 20, 2020, 12 pages.

Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.

Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.

Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.

Liu, C.Y. et al., Time Resolved Shadowgraph Images of Silicon during Laser Ablation: Shockwaves and Particle Generation, Journal of Physics: Conference Series 59 (2007) 338-342, 6 pages.

PCT International Search Report and Written Opinion dated Sep. 15, 2020, for International Application No. PCT/US2020/035778.

Taiwan Office Action dated Oct. 27, 2020 for Application No. 108148588.

Trusheim, D. et al., Investigation of the Influence of Pulse Duration in Laser Processes for Solar Cells, Physics Procedia Dec. 2011, 278-285, 9 pages.

Yu et al. "High Performance, High Density RDL for Advanced Packaging," 2018 IEEE 68th Electronic Components and Technology Conference, pp. 587-593, DOI 10.1109/ETCC.2018.0009.

U.S. Office Action dated May 13, 2021, in U.S. Appl. No. 16/870,843.

Chen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.

Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.

Malta, D., et al.—"Fabrication of TSV-Based Silicon Interposers," 3D Systems Integration Conference (3DIC), 2010 IEEE International, Nov. 16-18, 2010, 6 pages.

PCT International Search Report and Written Opinion dated Feb. 4, 2022, for International Application No. PCT/US2021/053830.

PCT International Search Report and Written Opinion dated Feb. 4, 2022, for International Application No. PCT/US2021/053821.

PCT International Search Report and Written Opinion dated Feb. 17, 2021 for International Application No. PCT/US2020/057787.

PCT International Search Report and Written Opinion dated Feb. 19, 2021, for International Application No. PCT/US2020/057788.

S. W. Ricky Lee et al. "3D Stacked Flip Chip Packaging with Through Silicon Vias and Copper Plating or Conductive Adhesive Filling", 2005 IEEE, pp. 798-801.

K. Sakuma et al. "3D Stacking Technology with Low-Volume Lead-Free Interconnections", IBM T.J. Watson Research Center. 2007 IEEE, pp. 627-632.

Chien-Wei Chien et al "Chip Embedded Wafer Level Packaging Technology for Stacked RF-SiP Application",2007 IEEE, pp. 305-310, 2007.

Chien-Wei Chien et al. "3D Chip Stack With Wafer Through Hole Technology". 6 pages, 2007.

Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.

Junghoon Yeom', et al. "Critical Aspect Ratio Dependence in Deep Reactive Ion Etching of Silicon", 2003 IEEE. pp. 1631-1634.

Ronald Hon et al. "Multi-Stack Flip Chip 3D Packaging with Copper Plated Through-Silicon Vertical Interconnection", 2005 IEEE. pp. 384-389.

NT Nguyen et al. "Through-Wafer Copper Electroplating for Three-Dimensional Interconnects", Journal of Micromechanics and Microengineering. 12 (2002) 395-399. 2002 IOP.

Arifur Rahman. "System-Level Performance Evaluation of Three-Dimensional Integrated Circuits", vol. 8, No. 6, Dec. 2000. pp. 671-678.

L. Wang, et al. "High aspect ratio through-wafer interconnections for 3Dmicrosystems", 2003 IEEE. pp. 634-637.

Li-Cheng Shen et al. "A Clamped Through Silicon Via (TSV) Interconnection for Stacked Chip Bonding Using Metal Cap on Pad and Metal Column Forming in Via", 2008 IEEE.

(56) References Cited

OTHER PUBLICATIONS

Daquan Yu, "Embedded Silicon Fan?Out (eSiFO®) Technology for Wafer?Level System Integration", 2019 Advances in Embedded and Fan-Out Wafer-Level Packaging Technologies, First Edition. pp. 169-184.
Tailong Shi et al. "First Demonstration of Panel Glass Fan-out (GFO) Packages for High I/O Density and High Frequency Multi-Chip Integration", 2017 IEEE 67th Electronic Components and Technology Conference, 6 pages.
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages, 2016.
International Search Report and Written Opinion dated Oct. 7, 2021 for Application No. PCT/US2021037375.
PCT International Search Report and Written Opinion dated Oct. 19, 2021, for International Application No. PCT/US2021/038690.
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
IMAPS 2016—49th International Symposium on Microelectronics—Pasadena, CA USA—Oct. 10-13, 2016, 5 pages.
Italian search report and written opinion for Application No. IT 201900006736 dated Mar. 2, 2020.
Italian Search Report and Written Opinion for Application No. IT 201900006740 dated Mar. 4, 2020.
Allresist Gmbh—Strausberg et al: "Resist-Wiki: Adhesion promoter HMDS and diphenylsilanedio (AR 300-80)—. . . —ALLRESIST GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/https://www.allresist.com/process-chemicals-adhesion-promoter-hmds-and-diphenylsilanedio/, [retrieved on Jan. 29, 2020].
International Search Report and Written Opinion for Application No. PCT/US2020/026832 dated Jul. 23, 2020.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Wu et al., Microelect. Eng., vol. 87 2010, pp. 505-509.
Han, Younggun, et al.—"Evaluation of Residual Stress and Warpage of Device Embedded Substrates with Piezo-Resistive Sensor Silicon Chips" technical paper, Jul. 31, 2015, pp. 81-94.
Doany, F.E., et al.—"Laser release process to obtain freestanding multilayer metal-polyimide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Srinivasan, R., et al.—"Ultraviolet Laser Ablation of Organic Polymers," Chemical Reviews, 1989, vol. 89, No. 6, pp. 1303-1316.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
Shen, Li-Cheng, et al.—"A Clamped Through Silicon Via (TSV) Interconnection for Stacked Chip Bonding Using Metal Cap on Pad and Metal Column Forming in Via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multi-chip Integration," Proceedings of 2017 IEEE 67th Electronic Components and Technology Conference, May 30-Jun. 2, 2017, pp. 41-46.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
PCT International Search Report and Written Opinion dated Aug. 28, 2020, for International Application No. PCT/US2020/032245.

RECONSTITUTED SUBSTRATE FOR RADIO FREQUENCY APPLICATIONS

CROSS-REFERENCE TO RELATED APPLICATIONS

This application claims benefit of priority to Italian patent application number 102019000006736, filed May 10, 2019, which is herein incorporated by reference in its entirety.

BACKGROUND

Field

Embodiments of the present disclosure generally relate to the field of semiconductor device manufacturing, and more particularly, to structures and methods of packaging semiconductor devices.

Description of the Related Art

In wireless networks such as mobile communication networks, connectivity and communication between devices is achieved through the utilization of miniaturized antenna systems having antennas in combination with other electrical elements such as receivers or transmitters. Recently, the demand for increased data transfer rates of wireless networks has led to the development of 5G and 6G technologies utilizing new radio frequency (RF) bands, which has imposed stringent specifications on the design of RF antennas and other corresponding supporting elements. Accordingly, miniaturized RF antenna systems with high gain, large bandwidth, and reduced footprint are becoming increasingly sought after for integration into compact and complex wireless electronic devices.

In order to be integrated into wireless electronic devices, miniaturized antenna systems are often assembled on package level or printed circuit board (PCB) level structures to interconnect semiconductor devices and their corresponding antennas. As wireless technology advances, these structures are evolving into increasingly complex 2D and 3D structures with millions of transistors, capacitors, and resisters integrated therein an in close proximity to each other and the assembled antenna systems. Traditionally, the package and PCB-level structures for antenna integration have utilized conventional semiconductor materials, such as silicon substrates. However, these conventional semiconductor materials are characterized by increased dissipation of electromagnetic energy, resulting in reduced radiation efficiency and limited bandwidth of antennas assembled in close proximity thereto. The lossy nature of conventional semiconductor materials is particularly evident when utilizing high frequency (HF) antenna systems for high frequency applications.

Therefore, what is needed in the art are improved structures and methods of forming substrate-level and/or package-level structures for high frequency applications.

SUMMARY

[Dependent Upon Finalized Claims]

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods and apparatus for forming thin-form-factor reconstituted substrates and semiconductor device packages for high frequency applications. The substrate and package structures described herein may be utilized in high-density 2D and 3D integrated devices for 4G, 5G, 6G, and other wireless network systems. In one embodiment, a silicon substrate is structured by laser ablation to include cavities for placement of semiconductor dies and vias for deposition of conductive interconnections. Additionally, one or more cavities are structured to be filled or occupied with a flowable dielectric material. Integration of one or more high frequency components adjacent the dielectric-filled cavities enables improved performance of the radio frequency ("RF") elements with reduced signal loss caused by the silicon substrate.

Figure 1:
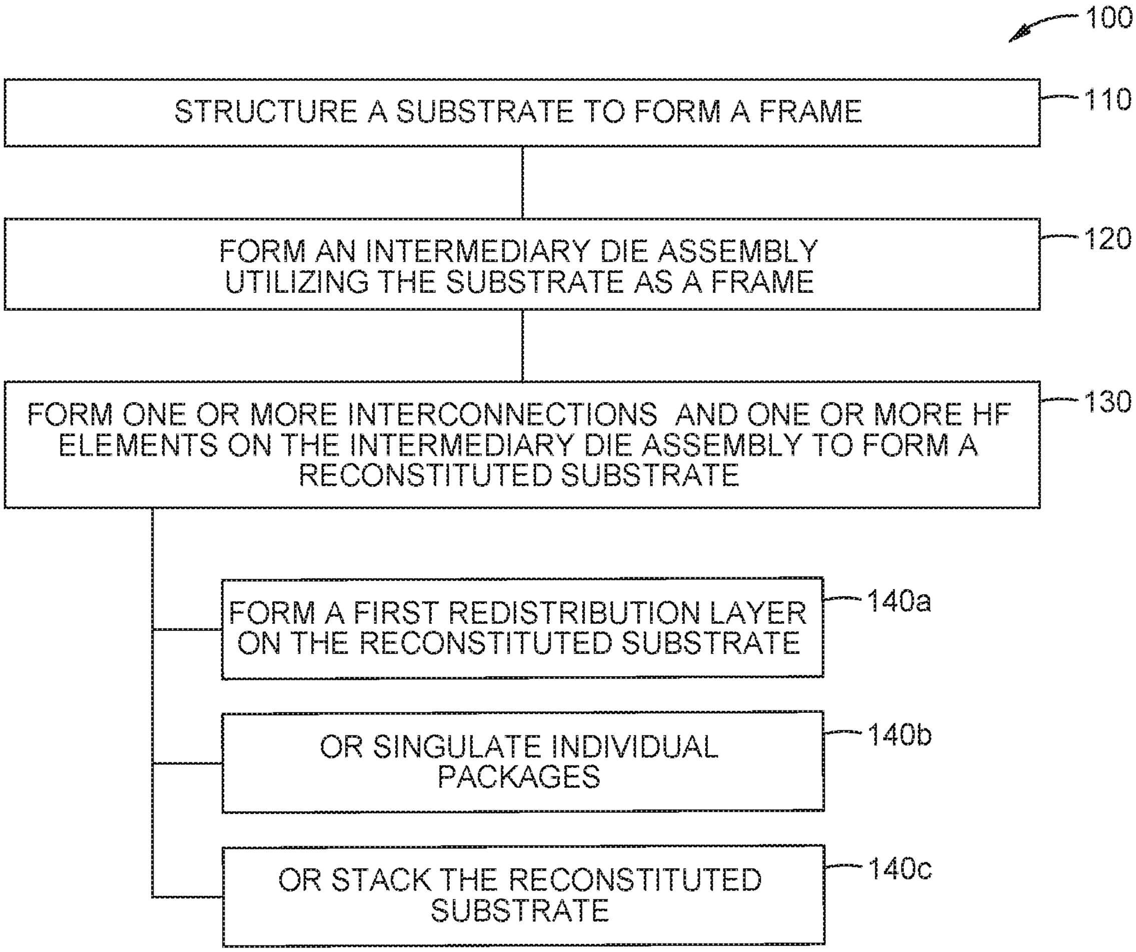
FIG. 1 illustrates a flow diagram of a process for forming a reconstituted substrate, according to embodiments described herein.

FIG. 1 illustrates a flow diagram of a representative method 100 of forming a reconstituted substrate, which may be homogeneous or heterogeneous with regards to the devices or dies integrated therein. The method 100 has multiple operations 110, 120, 130, and 140*a*-140*c*. Each operation is described in greater detail with reference to FIGS. 2-13D. The method may include one or more additional operations which are carried out before any of the defined operations, between two of the defined operations, or after all of the defined operations (except where the context excludes the possibility).

In general, the method 100 includes structuring a substrate to be used as a frame at operation 110, further described in greater detail with reference to FIGS. 2 and 3A-3D. At operation 120, an intermediary die assembly having one or more embedded devices and insulating materials is formed, which is described in greater detail with reference to FIGS. 4 and 5A-5K, and FIGS. 6 and 7A-7G. One or more interconnections and/or one or more radio frequency ("RF") elements are formed on the intermediary die assembly at operation 130, thus forming a functional reconstituted substrate, which is described in greater detail with reference to FIGS. 8 and 9A-9H. The reconstituted substrate may then have one or more redistribution layers formed thereon (140*a*), be singulated into individual packages or systems-in-packages (140*b*), and/or be utilized to form a stacked 3D structure (140*c*). Formation of the redistribution layers is described with reference to FIGS. 10 and 11-11L.

Figure 2:
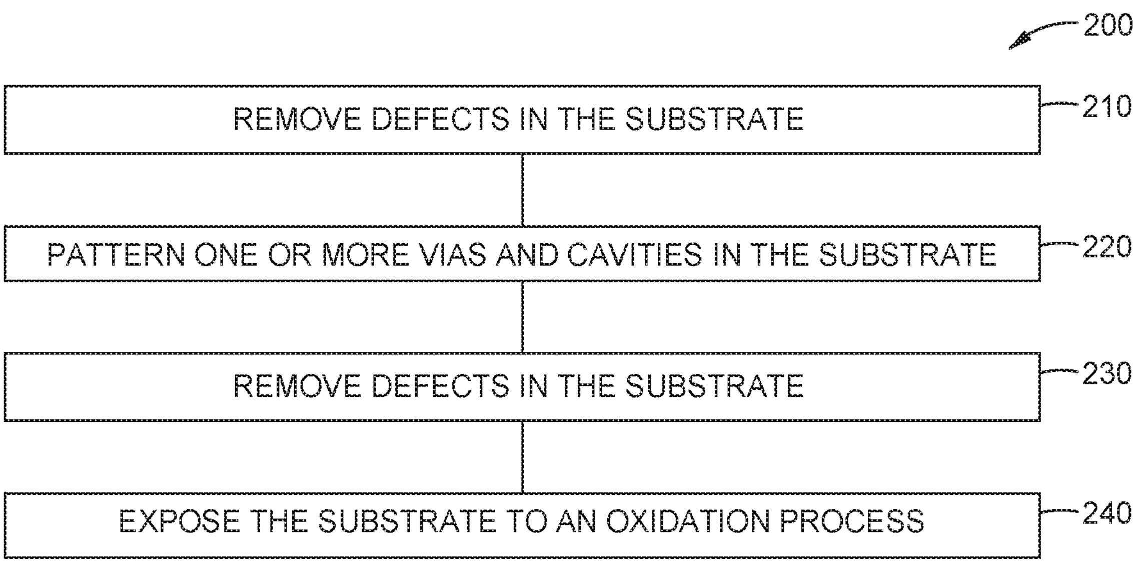
FIG. 2 illustrates a flow diagram of a process for substrate structuring for forming a reconstituted substrate, according to embodiments described herein.

FIG. 2 illustrates a flow diagram of a representative method 200 for structuring a substrate to be utilized as a reconstituted substrate frame. FIGS. 3A-3D schematically illustrate cross-sectional views of a substrate 302 at different stages of the substrate structuring process 200 represented in FIG. 2. Therefore, FIG. 2 and FIGS. 3A-3D are herein described together for clarity.

Figure 3A:
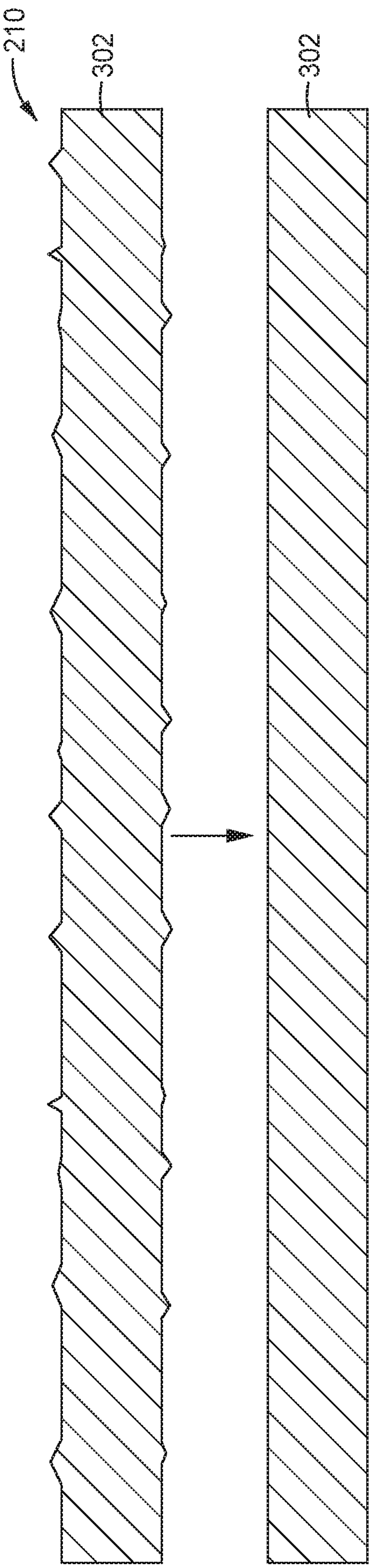
FIGS. 3A-3D schematically illustrate cross-sectional views of a substrate at different stages of the substrate structuring process depicted in FIG. 2.

The method 200 begins at operation 210 and corresponding FIG. 3A, wherein the substrate 302 is exposed to a first defect removal process. The substrate 302 is formed of any suitable substrate material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, glass (e.g., borosilicate glass), sapphire, alumina, and/or ceramic materials. In one embodiment, the substrate 302 is a monocrystalline p-type or n-type silicon substrate. In one embodiment, the substrate 302 is a polycrystalline p-type or n-type silicon substrate. In another embodiment, the substrate 302 is a p-type or n-type silicon solar substrate. The substrate 302 may further have a polygonal or circular shape. For example, the substrate 302 may include a substantially square silicon substrate having lateral dimensions between about 120 mm and about 180 mm, with or without chamfered edges. In another example, the substrate 302 may include a circular silicon-containing wafer having a diameter between about 20 mm and about 700 mm, such as between about 100 mm and about 500 mm, for example about 300 mm.

Unless otherwise noted, embodiments and examples described herein are conducted on substrates having a thickness between about 50 μm and about 1000 μm, such as between about 90 μm and about 780 μm. For example, the substrate 302 has a thickness between about 100 μm and about 300 μm, such as a thickness between about 110 μm and about 200 μm. In another example, the substrate 302 has a thickness between about 60 μm and about 160 μm, such as a thickness between about 80 μm and about 120 μm.

Prior to operation 210, the substrate 302 may be sliced and separated from a bulk material by wire sawing, scribing and breaking, mechanical abrasive sawing, or laser cutting. Slicing typically causes mechanical defects or deformities in substrate surfaces formed therefrom, such as scratches, micro-cracking, chipping, and other mechanical defects. Thus, the substrate 302 is exposed to the first defect removal process at operation 210 to smoothen and planarize surfaces thereof and remove any mechanical defects in preparation for later structuring and packaging operations. In some embodiments, the substrate 302 may further be thinned by adjusting the process parameters of the first defect removal process. For example, a thickness of the substrate 302 may be decreased with increased exposure to the first defect removal process.

In some embodiments, the first defect removal process at operation 210 includes exposing the substrate 302 to a substrate polishing process and/or an etch process followed by rinsing and drying processes. For example, the substrate 302 may be exposed to a chemical mechanical polishing (CMP) process at operation 210. In some embodiments, the etch process is a wet etch process including a buffered etch process that is selective for the removal of desired materials (e.g., contaminants and other undesirable compounds). In other embodiments, the etch process is a wet etch process utilizing an isotropic aqueous etch process. Any suitable wet etchant or combination of wet etchants may be used for the wet etch process. In one embodiment, the substrate 302 is immersed in an aqueous HF etching solution for etching. In another embodiment, the substrate 302 is immersed in an aqueous KOH etching solution for etching. During the etch process, the etching solution may be heated to a temperature between about 30° C. and about 100° C., such as between about 40° C. and about 90° C., in order to accelerate the etching process. For example, the etching solution is heated to a temperature of about 70° C. during the etch process.

In still other embodiments, the etch process at operation 210 is a dry etch process. An example of a dry etch process includes a plasma-based dry etch process.

The thickness of the substrate 302 may be modulated by controlling the time of exposure of the substrate 302 to the polishing process and/or the etchants (e.g., the etching solution) used during the etch process. For example, a final thickness of the substrate 302 may be reduced with increased exposure to the polishing process and/or etchants. Alternatively, the substrate 302 may have a greater final thickness with decreased exposure to the polishing process and/or the etchants.

Figure 3B:
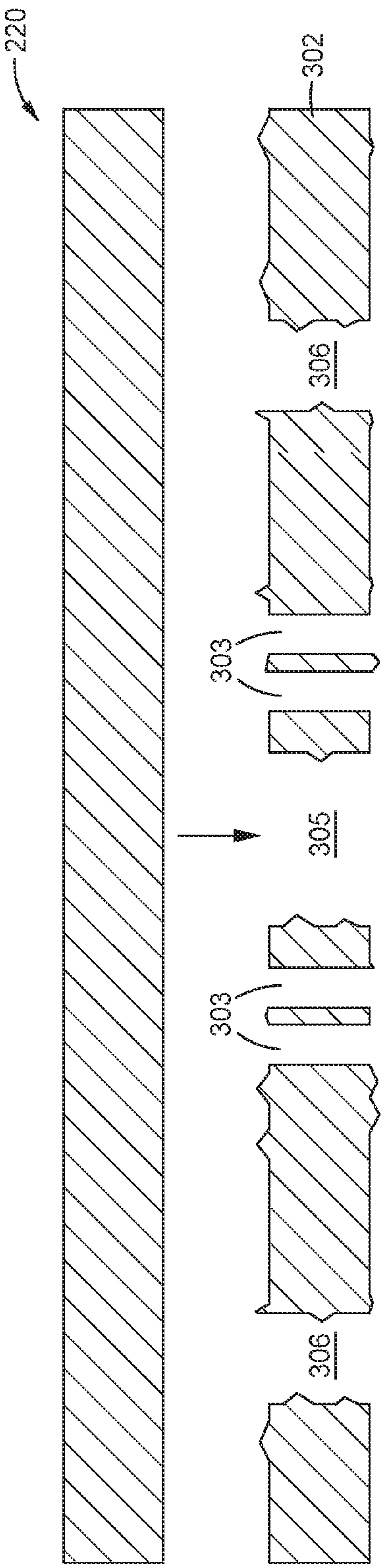

At operations 220 and 230, the now planarized and substantially defect-free substrate 302 has one or more features, such as vias 303, primary cavities 305, and secondary cavities 306 patterned therein and smoothened (one primary cavity 305, two secondary cavities 306, and four vias 303 are depicted in the lower cross-section of the substrate 302 in FIG. 3B for clarity). The vias 303 are utilized to form direct contact electrical interconnections through the substrate 302, the primary cavities 305 are utilized to receive and enclose (i.e., embed) one or more semiconductor dies therein, and the secondary cavities 306 are utilized to contain a dielectric material therein and support one or more RF elements thereover. As discussed herein, RF elements may include various RF communication elements (e.g., UHF, VHF, HF or MF communication elements), such as antennas or other RF passive elements that facilitate various wireless communication, wireless signal receiving, wireless signal transmitting and/or wireless sensing technologies. By integrating RF elements adjacent the dielectric-filled secondary cavities 306 and away from the substrate 302, radiation loss caused by the lossy substrate 302 may be limited. Although only depicting three cavities and four vias, the substrate structuring processes described herein with reference to operations 210-250 and FIGS. 3A-3D may be utilized to form patterned features in the substrate 302 having any desired depth, lateral dimensions, morphologies, and arrangements.

In one embodiment, a desired pattern is formed in the substrate 302, such as a solar substrate or even a semiconductor wafer, by laser ablation. The laser ablation system utilized to laser drill features in the substrate 302 may include any suitable type of laser source. In some examples, the laser source is an infrared (IR) laser. In some examples the laser source is a picosecond UV laser. In other examples, the laser source is a femtosecond UV laser. In yet other examples, the laser source is a femtosecond green laser. The laser source generates a continuous or pulsed laser beam for patterning of the substrate. For example, the laser source may generate a pulsed laser beam having a frequency between 5 kHz and 500 kHz, such as between 10 kHz and about 200 kHz. In one example, the laser source 407 is configured to deliver a pulsed laser beam at a wavelength of between about 200 nm and about 1200 nm and at a pulse duration between about 10 ns and about 5000 ns with an output power of between about 10 Watts and about 100 Watts. The laser source is configured to form any desired pattern and features in the substrate 302, including the primary cavities 305, secondary cavities 306, and vias 303 described above and depicted in FIG. 3B.

Figure 3C:
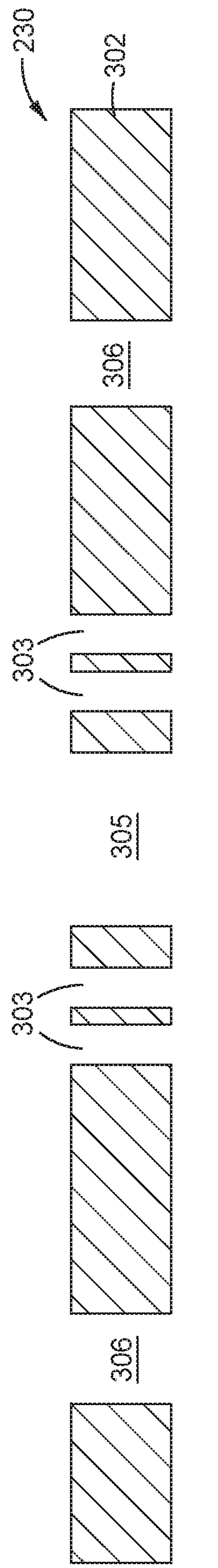

Similar to the process of separating the substrate 302 from the bulk material, the laser patterning of the substrate 302 may cause unwanted mechanical defects on the surfaces of the substrate 302 such as chipping and cracking. Thus, after forming desired features in the substrate 302 by direct laser patterning, the substrate 302 is exposed to a second defect removal and cleaning process substantially similar to the first defect removal process described above. FIGS. 3B and 3C illustrate the structured substrate 302 before and after performing the second damage removal and cleaning process, resulting in a smoothened substrate 302 having the primary and secondary cavities 305, 306 and vias 303 formed therein.

During the second damage removal process at operation 230, the substrate 302 is etched, rinsed, and dried. The etch process proceeds for a predetermined duration to smoothen the surfaces of the substrate 302, and in particular, the surfaces exposed to laser patterning. In another aspect, the etch process is utilized to remove any undesired debris remaining from the laser ablation process. The etch process may be isotropic or anisotropic. In some embodiments, the etch process is a wet etch process utilizing any suitable wet etchant or combination of wet etchants in aqueous solution. For example, the substrate 302 may be immersed in an aqueous HF etching solution or an aqueous KOH etching solution. In some embodiments, the etching solution is heated to further accelerate the etching process. For example, the etching solution may be heated to a temperature between about 40° C. and about 80° C., such as between about 50° C. and about 70° C., such as a temperature of about 60° C. during etching of the substrate 302. In still other embodiments, the etch process at operation 230 is a dry etch process. An example of a dry etch process includes a plasma-based dry etch process.

FIG. 3C illustrates a longitudinal cross-section of the substrate 302 upon completion of operation 230. As described above, the substrate 302 in FIG. 3C is depicted having a single primary cavity 305, two secondary cavities 306, and four vias 303 formed therethrough. The primary and secondary cavities 305, 306 are depicted having different lateral dimensions, thus enabling the cavities to serve different functions within the subsequently formed reconstituted substrate. For example, the primary cavity 305 is utilized to receive and contain (e.g., enclose) a semiconductor device and/or die therein, while the secondary cavities 306 may be later filled with a flowable dielectric material to serve as support structures for the integration of one or more RF elements formed thereover. It is believed that the dielectric materials provide better electrical isolation than silicon and thus, having RF elements formed over dielectric-filled second cavities 306 enables reduced radiation dissipation as compared to the silicon substrate 302.

Figure 3D:
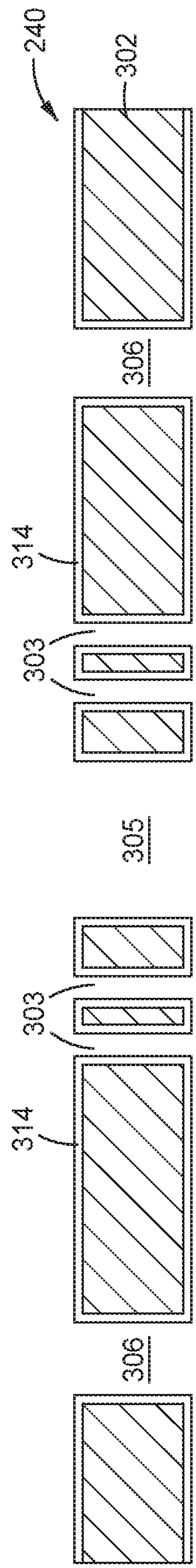

In one example, the primary cavity 305 has an RF chip placed and embedded therein, and the secondary cavities 306 are filled with a flowable dielectric material upon which antennas or other RF passive elements are formed. Accordingly, the primary cavities 305 may be shaped and sized to accommodate any desired devices and/or dies therein and the secondary cavities 306 may be shaped and sized to have at least the dimensions of the RF elements to be formed thereover. Although only three cavities and four vias are depicted in FIGS. 3B-3D, any number and arrangement of cavities and vias may be formed in the substrate while performing the method 200.

In one embodiment, the primary and secondary cavities 305, 306 and vias 303 have a depth equal to the thickness of the substrate 302, thus forming holes on opposing surfaces of the substrate 302 (e.g., through the thickness of the substrate 302). For example, the primary and secondary cavities 305, 306 and the vias 303 formed in the substrate 302 may have a depth of between about 50 μm and about 1 mm, such as between about 100 μm and about 200 μm, such as between about 110 μm and about 190 μm, depending on the thickness of the substrate 302. In other embodiments, the primary and secondary cavities 305, 306 and/or the vias 303 may have a depth equal to or less than the thickness of the substrate 302, thus forming a hole in only one surface (e.g., side) of the substrate 302.

In one embodiment, each primary and secondary cavity 305, 306 has lateral dimensions ranging between about 0.1 mm and about 50 mm, such as between about 1 mm and about 15 mm, such as between about 5 mm and about 10 mm, depending on the dimensions of one or more semiconductor devices or dies to be embedded therein or the dimensions of one or more RF elements to be integrated thereon. In some embodiments, the primary cavities 305 have larger lateral dimensions than the secondary cavities 306. For example, the primary cavities 305 have lateral dimensions between about 1 mm and about 50 mm, and the secondary cavities have lateral dimensions between about 0.2 mm and about 3 mm. In one embodiment, the primary and secondary cavities 305, 306 are sized to have lateral dimensions substantially similar to that of the semiconductor devices or dies or RF elements. For example, each primary and secondary cavity 305, 306 is formed having lateral dimensions exceeding those of the corresponding semiconductor device, die, or RF element by less than about 150 μm, such as less than about 120 μm, such as less than 100 μm. Having a reduced variance in the size of the primary and secondary cavities 305, 306 and the semiconductor devices, dies, or RF elements to be embedded therein or thereon reduces the amount of gap-fill material necessitated thereafter.

The vias 303 are generally substantially cylindrical in shape. However, other morphologies for the vias 303 are also contemplated. For example, the vias 303 may have a tapered or conical morphology, wherein a diameter at a first end thereof is larger than a diameter and a second end thereof. Formation of tapered or conical morphologies may be accomplished by moving the laser beam from the laser source utilized during structuring in a spiraling (e.g., circular, corkscrew) motion relative to the central axis of each of the vias 303. The laser beam may also be angled using a motion system to form tapered vias 303. The same methods may also be utilized to form cylindrical vias 303 having uniform diameters therethrough.

In one embodiment, each via 303 has a diameter ranging between about 20 μm and about 200 μm, such as between about 50 μm and about 150 μm, such as between about 60 μm and about 130 μm, such as between about 80 μm and 110 μm. A minimum pitch between centers of adjacent vias 303 is between about 70 μm and about 200 μm, such as between about 85 μm and about 160 μm, such as between about 100 μm and 140 μm.

At operation 240, the substrate 302 is exposed to an optional oxidation process to grow or deposit an insulating oxide film (i.e. layer) 314 on desired surfaces thereof after removal of mechanical defects. For example, the oxide film 314 may be formed on all surfaces of the substrate 302 such that it surrounds the substrate 302. The insulating oxide film 314 acts as a passivating layer on the substrate 302 and provides a protective outer barrier against corrosion and other forms of damage. In one embodiment, the oxidation process is a thermal oxidation process. The thermal oxidation process is performed at a temperature of between about 800° C. and about 1200° C., such as between about 850° C. and about 1150° C. For example, the thermal oxidation process is performed at a temperature of between about 900° C. and about 1100° C., such as a temperature of between about 950° C. and about 950° C. In one embodiment, the thermal oxidation process is a wet oxidation process utilizing water vapor as an oxidant. In one embodiment, the thermal oxidation process is a dry process utilizing molecular oxygen as the oxidant. It is contemplated that the substrate 302 may be exposed to any suitable oxidation process at operation 240 to form the oxide film 314 thereon. In some embodiments, the oxide film 314 is a silicon dioxide film. The oxide film 314 generally has a thickness between about 100 nm and about 3 μm, such as between about 200 nm and about 2.5 μm. For example, the oxide film 314 has a thickness between about 300 nm and about 2 μm, such as about 1.5 μm.

Figure 4:
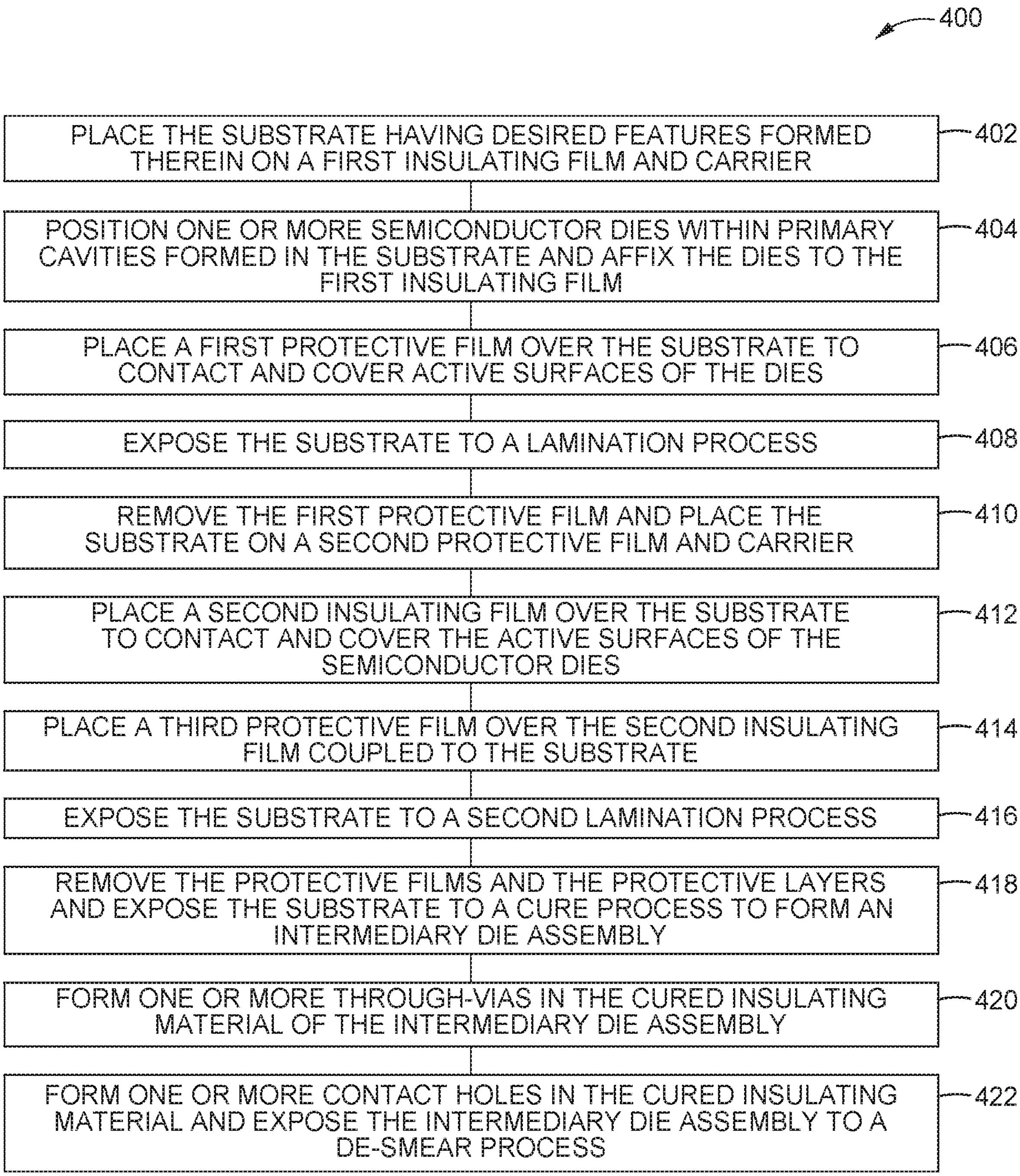
FIG. 4 illustrates a flow diagram of a process for forming an intermediary die assembly having through-assembly vias and contact holes, according to embodiments described herein.

After structuring, the substrate 302 may be utilized as a frame to form a reconstituted substrate in subsequent packaging operations. FIGS. 4 and 6 illustrate flow diagrams of representative methods 400 and 600, respectively, for fabricating an intermediary die assembly 502 around the substrate 302 prior to completed (e.g., final) reconstituted substrate or package formation. FIGS. 5A-5K schematically illustrate cross-sectional views of the substrate 302 at different stages of the method 400 depicted in FIG. 4, and FIGS. 7A-7G schematically illustrate cross-sectional views of the substrate 302 at different stages of the method 600 depicted in FIG. 5. For clarity, FIG. 4 and FIGS. 5A-5K are herein described together and FIG. 5 and FIGS. 7A-7G are herein described together.

Figure 5A:
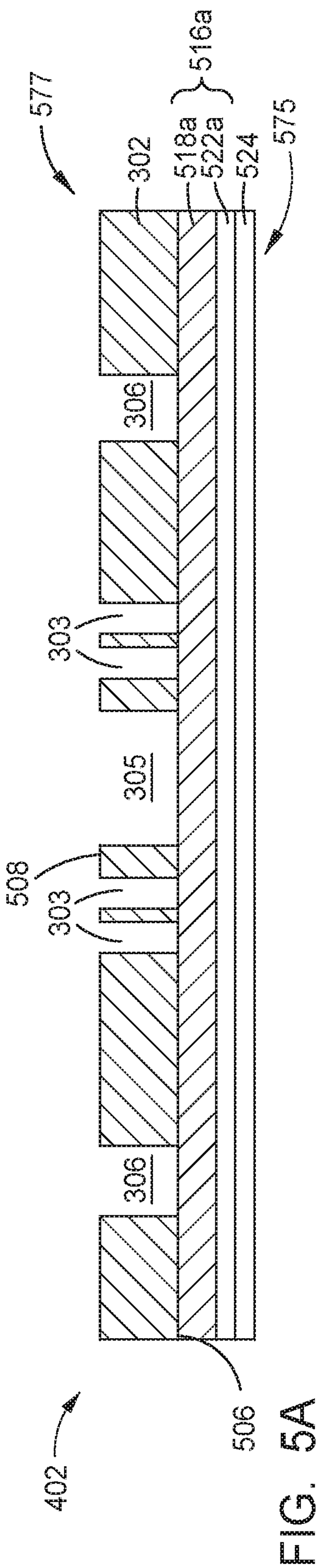
FIGS. 5A-5K schematically illustrate cross-sectional views of the intermediary die assembly at different stages of the process depicted in FIG. 4.
Figure 6:
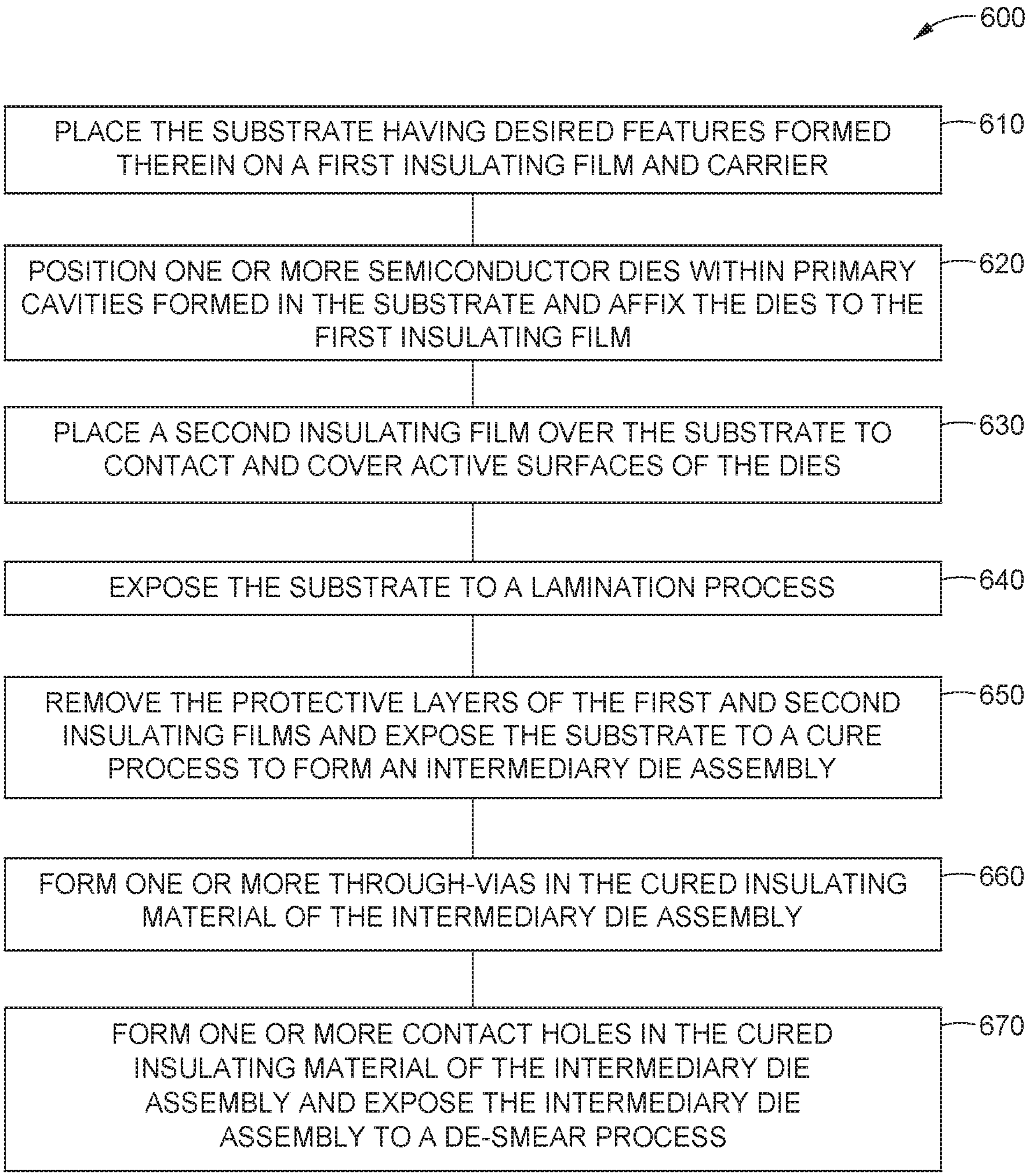
FIG. 6 illustrates a flow diagram of a process for forming an intermediary die assembly having through-assembly vias and contact holes, according to embodiments described herein.

Generally, the method 400 begins at operation 402 and FIG. 5A wherein a first side 575 (e.g., a first major surface 506) of the substrate 302, now having desired features formed therein, is placed on a first insulating film 516*a*. In some embodiments, the first insulating film 516*a* includes one or more flowable layers 518*a* formed of polymer-based dielectric materials. Examples of suitable polymer-based dielectric materials include polyimides, silazane-based polymers, acrylics, epoxy molding compounds, and other low-k dielectric materials. Generally, the flowable layers 518 are formed of a dielectric material have a dielectric constant (k) value between about 3.1 and about 3.2, and a loss tangent (tan 5) of between about 0.004 and about 0.02. In the embodiment depicted in FIG. 5A, the first insulating film 516*a* includes a flowable layer 518*a* formed of an epoxy resin.

In some examples, the flowable layer 518*a* may be formed of a ceramic-filler or particle-containing epoxy resin, such as an epoxy resin filled with (e.g., containing) substantially spherical silica ($SiO_2$) particles. As used herein, the term "spherical" refers to any round, ellipsoid, or spheroid shape. For example, in some embodiments, the ceramic fillers may have an elliptic shape, an oblong oval shape, or other similar round shape. However, other morphologies are also contemplated. Other examples of ceramic fillers that may be utilized to form the flowable layer 518*a* and other layers of the insulating film 516*a* include aluminum nitride (AlN), aluminum oxide ($Al_2O_3$), silicon carbide (SiC), silicon nitride ($Si_3N_4$), $Sr_2Ce_2Ti_5O_{16}$), zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like.

In some examples, the ceramic fillers utilized to form the flowable layer 518*a* have particles ranging in size between about 40 nm and about 1.5 μm, such as between about 80 nm and about 1 μm. For example, the ceramic fillers utilized to form the flowable layer 518*a* have particles ranging in size between about 200 nm and about 800 nm, such as between about 300 nm and about 600 nm. In some embodiments, the ceramic fillers include particles having a size less than about 25% of a width or diameter of the features (e.g., via, cavity, or through-assembly via) formed in the substrate, such as less than about 15% of a desired feature's width or diameter.

The flowable layer 518*a* typically has a thickness less than about 60 μm, such as between about 5 μm and about 50 μm. For example, the flowable layer 518*a* has a thickness between about 10 μm and about 25 μm. In one embodiment, the insulating film 516*a* may further include one or more protective layers. For example, the insulating film 516*a* includes a polyethylene terephthalate (PET) protective layer 522*a*. However, any suitable combination of layers and insulating materials is contemplated for the insulating film 516*a*. In some embodiments, the entire insulating film 516*a* has a thickness less than about 120 μm, such as a thickness less than about 90 μm.

The substrate 302, which is coupled to the insulating film 516*a* on the first side 575 thereof, and specifically to the flowable layer 518*a* of the insulating film 516*a*, may further be optionally placed on a carrier 524 for mechanical support during later processing operations. The carrier is formed of any suitable mechanically and thermally stable material. For example, the carrier 524 is formed of polytetrafluoroethylene (PTFE). In another example, the carrier 524 is formed of PET.

Figure 5B:
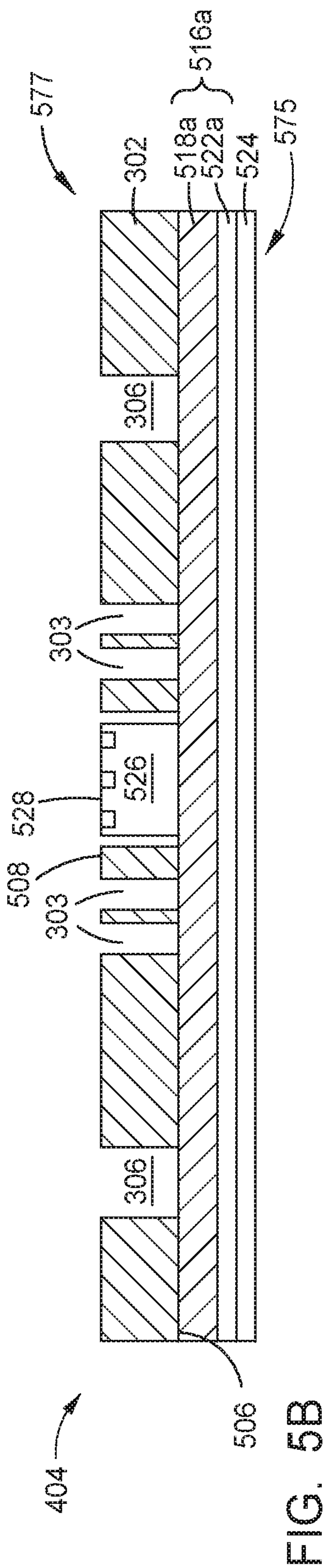

At operation 404 and depicted in FIG. 5B, one or more semiconductor dies 526 are placed within the primary cavities 305 formed in the substrate 302 so that the semiconductor dies 526 are bound by the insulating film 516*a* on one side and the substrate 302 on four or more sides (one semiconductor die 526 is depicted in FIG. 5B). The semiconductor dies 526 are placed only within the primary cavities 305 which intended to enclose and house semiconductor dies 526 therein, while the secondary cavities 306 remain without any semiconductor dies 526 for subsequent filling with a flowable dielectric material. The secondary cavities 306 containing only the flowable dielectric material therein are later utilized to support one or more RF elements, including antennas or other RF passive elements. In FIG. 5B, the central primary cavity 305 has a single semiconductor die 526 placed therein, while peripheral secondary cavities 306 are left without any semiconductor dies 526. Accordingly, the secondary cavities 306 will subsequently be filled with flowable dielectric material and utilized to support an RF element thereon.

The semiconductor dies 526 placed within the primary cavities 305 are positioned over a surface of the insulating film 516*a* exposed through the primary cavities 305. In one embodiment, the semiconductor dies 526 are placed on an optional adhesive layer (not shown) disposed or formed over the insulating film 516*a*. Generally, the one or more semiconductor dies 526 are multipurpose dies having integrated circuits formed on active surfaces 528 thereof. For example, the one or more semiconductor dies 526 include RF chips. In some embodiments, the semiconductor dies 526 are all of the same type of semiconductor device or die. In other embodiments, the semiconductor dies 526 include different types of semiconductor devices or dies.

Figure 5C:
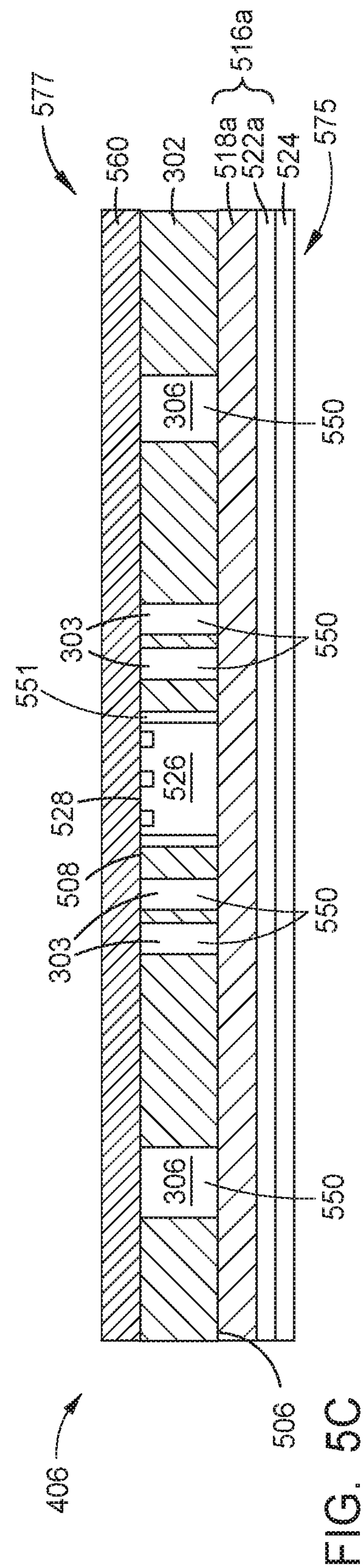

After placement of the dies 526 within the primary cavities 305, a first protective film 560 is placed over a second side 577 (e.g., surface 508) of the substrate 302 at operation 406 and FIG. 5C. The protective film 560 is coupled to the second side 577 of the substrate 302 and opposite of the first insulating film 516*a* such that it contacts and covers the active surfaces 528 of the dies 526 disposed within the primary cavities 305. In one embodiment, the protective film 560 is formed of a similar material to that of the protective layer 522*a*. For example, the protective film 560 is formed of PET, such as biaxial PET. However, the protective film 560 may be formed of any suitable protective materials. In some embodiments, the protective film 560 has a thickness between about 50 μm and about 150 μm.

Figure 5D:
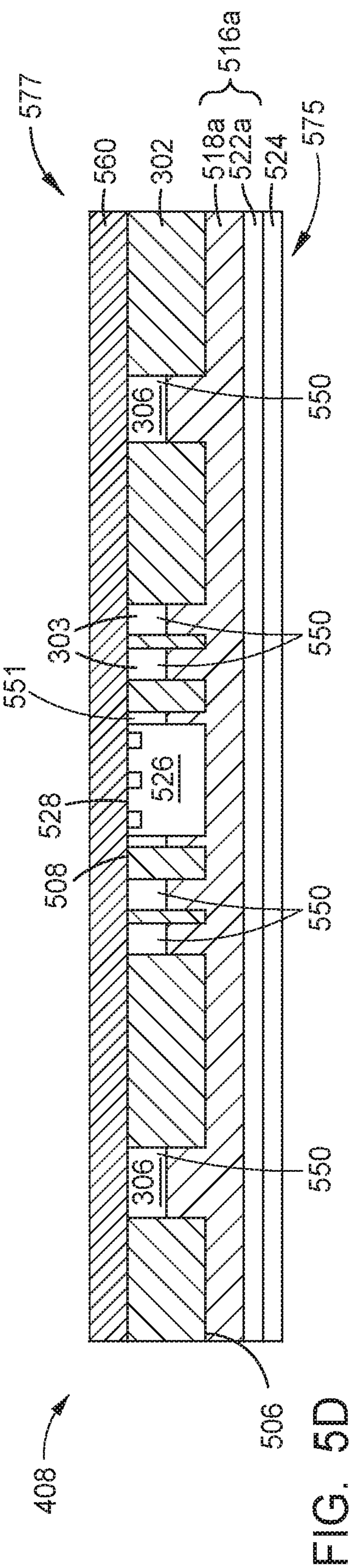

The substrate 302, now affixed to the insulating film 516*a* on the first side 575 and the protective film 560 on the second side 577 and further having dies 526 disposed in primary cavities 305 therein, is exposed to a first lamination process at operation 408. During the lamination process, the substrate 302 is exposed to elevated temperatures, causing the flowable layer 518*a* of the insulating film 516*a* to soften and flow into open volumes between the insulating film 516*a* and the protective film 560, such as into voids 550 within the vias 303 and secondary cavities 306 and gaps 551 between the interior walls of the primary cavities 305 and the dies 526. Accordingly, the semiconductor dies 526 become at least partially embedded in the material of the insulating film 516*a* within the primary cavities 305 and the secondary cavities 306 and the vias 303 become partially filled with material of the insulating film 516*a*, as depicted in FIG. 5D.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 5 seconds and about 1.5 minutes, such as between about 30 seconds and about 1 minute. In some embodiments, the lamination process includes the application of a pressure of between about 1 psig and about 50 psig while a temperature of between about 80° C. and about 140° C. is applied to substrate 302 and insulating film 516*a* for a period between about 5 seconds and about 1.5 minutes. For example, the lamination process is performed at a pressure of between about 5 psig and about 40 psig, a temperature of between about 100° C. and about 120° C. for a period between about 10 seconds and about 1 minute. For example, the lamination process is performed at a temperature of about 110° C. for a period of about 20 seconds.

Figure 5E:
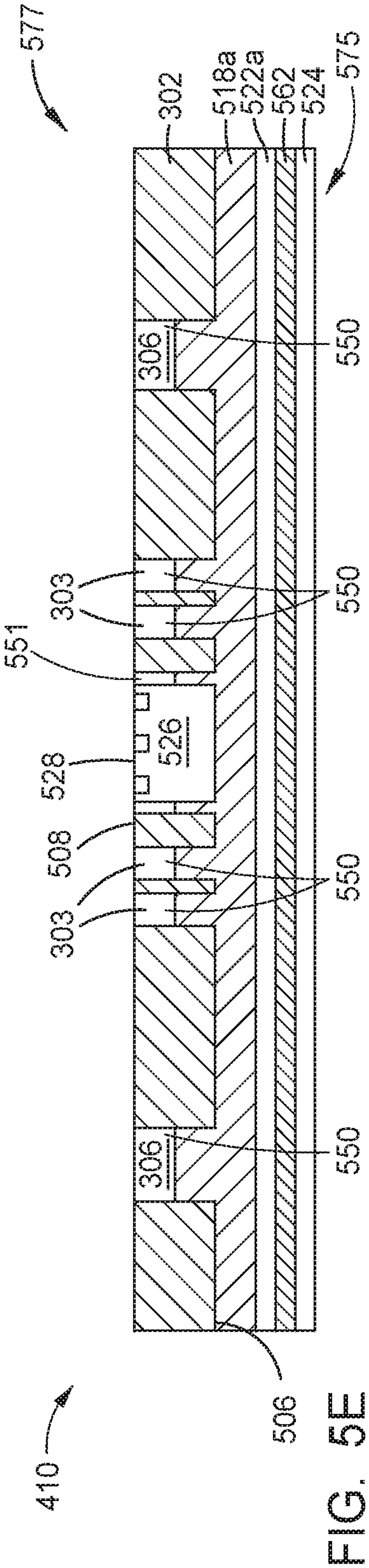

At operation 410, the protective film 560 is removed and the substrate 302, now having the laminated insulating material of the flowable layer 518*a* at least partially surrounding the one or more dies 526 within the primary cavities 305 and partially filling the vias 303 and the secondary cavities 306, is coupled to a second protective film 562. As depicted in FIG. 5E, the second protective film 562 is coupled to the first side 575 of the substrate 302 such that the second protective film 562 is disposed against (e.g., adjacent) the protective layer 522*a* of the insulating film 516*a*. In some embodiments, the substrate 302 now coupled to the protective film 562, may be optionally placed on the carrier 524 for additional mechanical support on the first side 575. In some embodiments, the protective film 562 is placed on the carrier 524 prior to coupling the protective film 562 with the substrate 302, now laminated with the insulating film 516*a*. Generally, the protective film 562 is substantially similar in composition to the protective film 560. For example, the protective film 562 may be formed of PET, such as biaxial PET. However, the protective film 562 may be formed of any suitable protective materials. In some embodiments, the protective film 562 has a thickness between about 50 μm and about 150 μm.

Figure 5F:
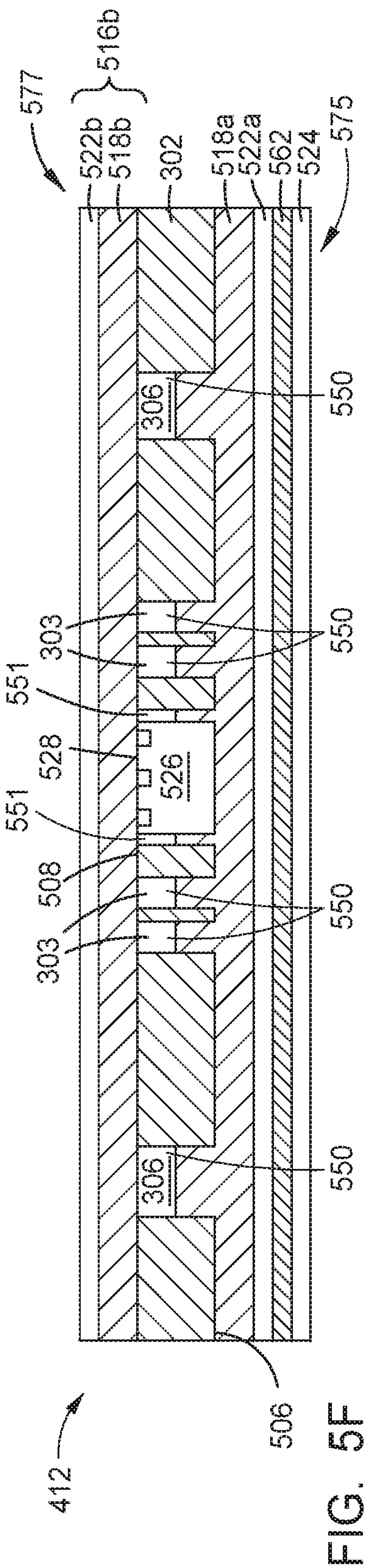

Upon coupling the substrate 302 to the second protective film 562, a second insulating film 516*b* substantially similar to the first insulating film 516*a* is placed on the second side 577 of the substrate 302 at operation 412 and FIG. 5F, thus replacing the protective film 560. In one embodiment, the second insulating film 516*b* is positioned on the second side 577 of the substrate 302 such that a flowable layer 518*b* of the second insulating film 516*b* contacts and covers the active surface 528 of the dies 526 within the primary cavities 305. In one embodiment, the placement of the second insulating film 516*b* on the substrate 302 encloses the voids 550 and gaps 551 between the insulating film 516*b* and the already-laminated insulating material of the flowable layer 518*a* partially surrounding the one or more dies 526. The second insulating film 516*b* may include one or more layers formed of polymer-based dielectric materials. As depicted in FIG. 5F, the second insulating film 516*b* includes a flowable layer 518*b* which is similar to the flowable layer 518*a* described above. The second insulating film 516*b* may further include a protective layer 522*b* formed of similar materials to the protective layer 522*a*, such as PET.

Figure 5G:
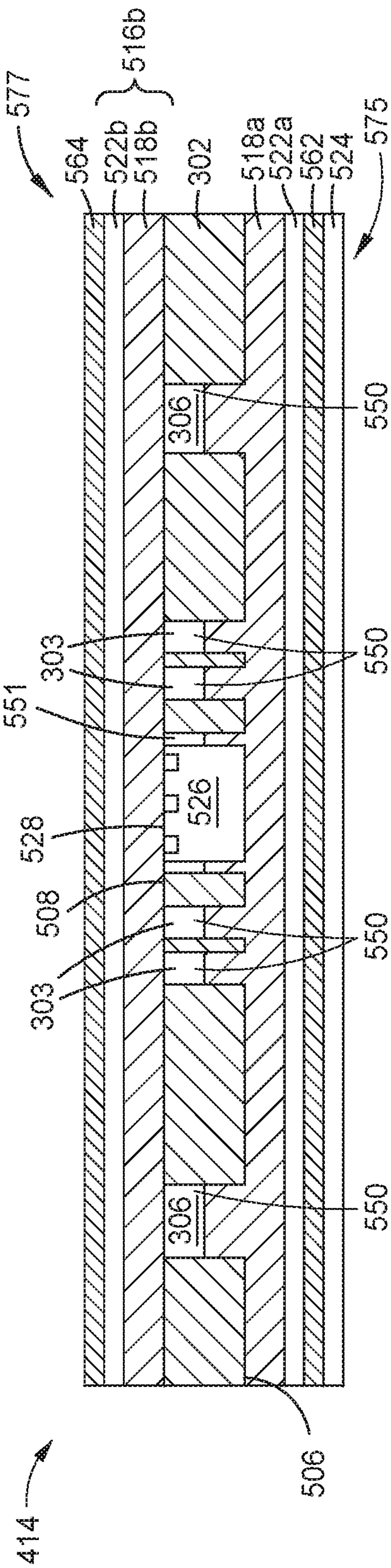

At operation 414, a third protective film 564 is placed over the second insulating film 516*b*, as depicted in FIG. 5G. Generally, the protective film 564 is substantially similar in composition to the protective films 560, 562. For example, the protective film 564 is formed of PET, such as biaxial PET. However, the protective film 564 may be formed of any suitable protective materials. In some embodiments, the protective film 564 has a thickness between about 50 μm and about 150 μm.

Figure 5H:
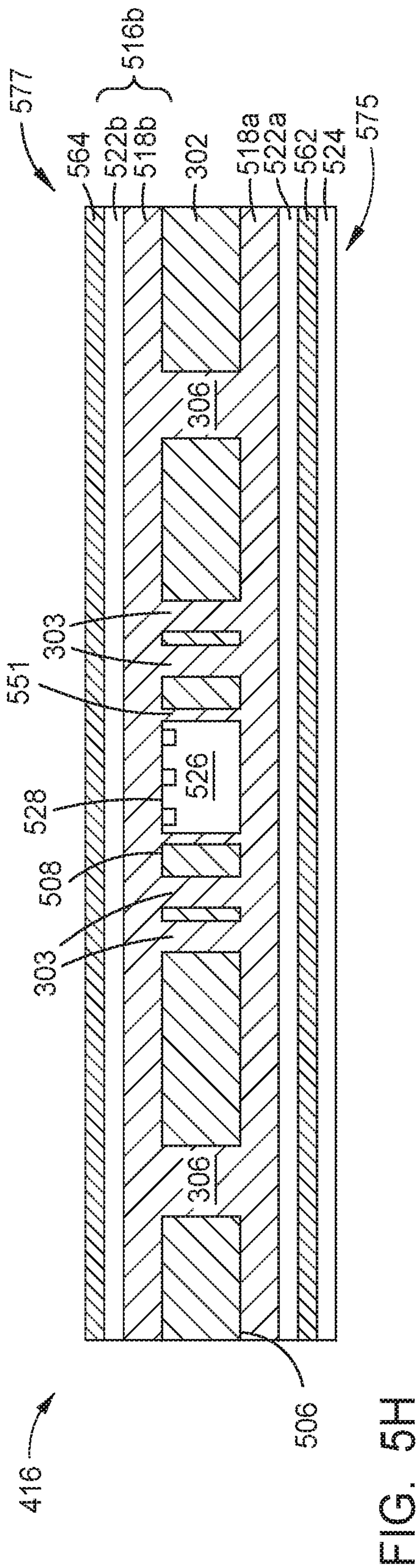

The substrate 302, now affixed to the insulating film 516*b* and protective layer 564 on the second side 577 and the protective film 562 and optional carrier 524 on the first side 575, is exposed to a second lamination process at operation 416 and FIG. 5H. Similar to the lamination process at operation 408, the substrate 302 is exposed to elevated temperatures, causing the flowable layer 518*b* of the insulating film 516*b* to soften and flow into gaps between the insulating film 516*b* and the already-laminated insulating material of the flowable layer 518*a*, thus integrating itself with the insulating material of the flowable layer 518*a*. Accordingly, the voids 550 and gaps 551 become filled (e.g. packed, sealed) with insulating material, and the semiconductor dies 526 placed within the primary cavities 305 become entirely embedded within the insulating material of the flowable layers 518*a*, 518*b*.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between about 10 psig and about 150 psig while a temperature of between about 80° C. and about 140° C. is applied to substrate 302 and insulting film 516*b* for a period between about 1 minute and about 30 minutes. For example, the lamination process is performed at a pressure of between about 20 psig and about 100 psig, a temperature of between about 100° C. and about 120° C. for a period between about 2 minutes and 10 minutes. For example, the lamination process is performed at a temperature of about 110° C. for a period of about 5 minutes.

Figures 5I, 5J, 5K:
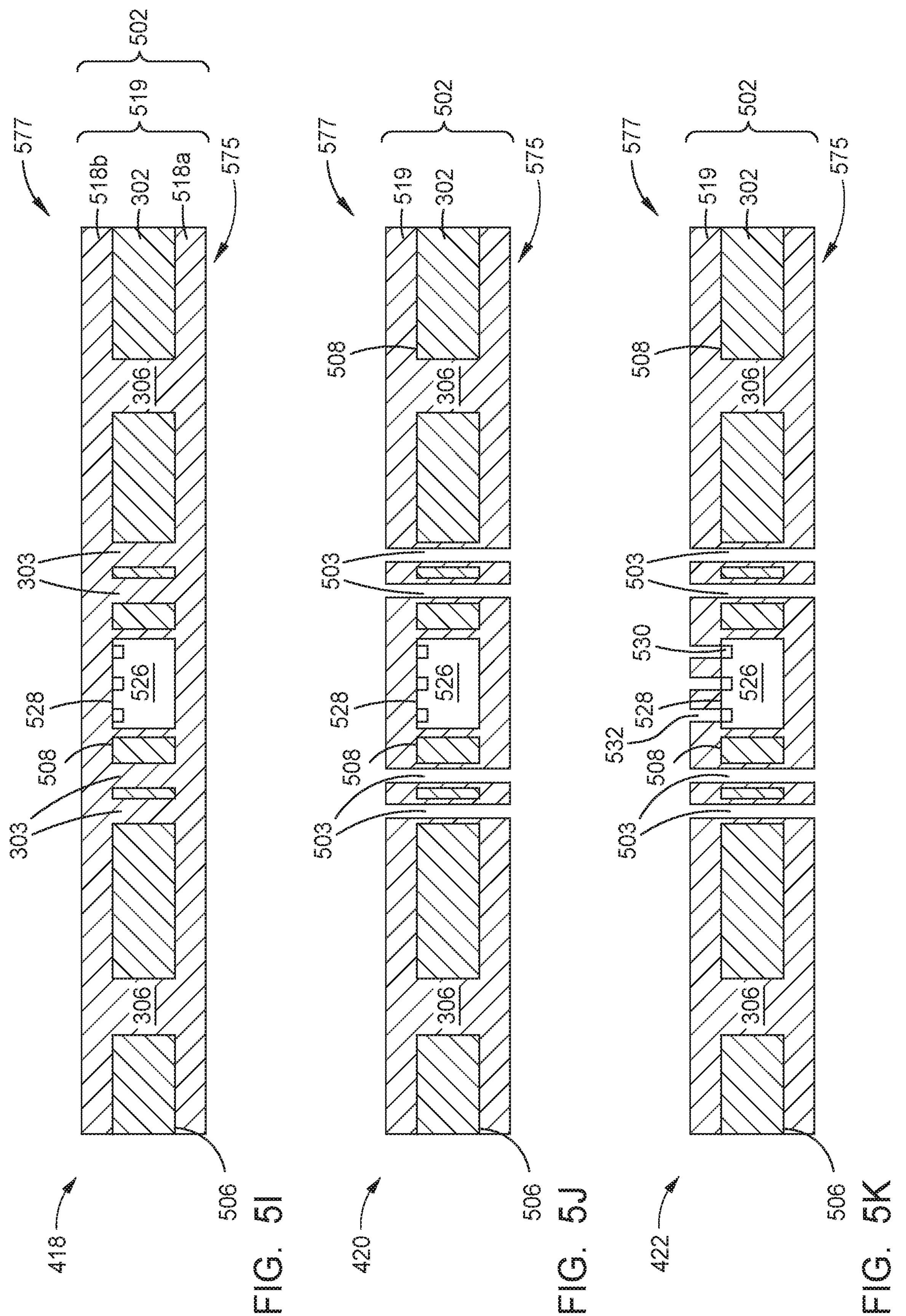

After lamination, the substrate 302 is disengaged from the carrier 524 and the protective films 562, 564 are removed at operation 418, resulting in a laminated intermediary die assembly 502. As depicted in FIG. 5I, the intermediary die assembly 502 includes the substrate 302 having one or more primary and secondary cavities 305, 306 and/or vias 303 formed therein and filled with the insulating dielectric material of the flowable layers 518*a*, 518*b*, in addition to the dies 526 embedded within the primary cavities 305. The insulating dielectric material of the flowable layers 518*a*, 518*b* encases the substrate 302 such that the insulating material covers at least two surfaces or sides of the substrate 302, such as major surfaces 506, 508, and contacts all sides of the embedded semiconductor dies 526. In some examples, the protective layers 522*a*, 522*b* are also removed from the intermediary die assembly 502 at operation 518. Generally, the protective layers 522*a* and 522*b*, the carrier 524, and the protective films 562 and 564 are removed from the intermediary die assembly 502 by any suitable mechanical processes, such as peeling therefrom.

Upon removal of the protective layers 522*a*, 522*b* and the protective films 562, 564, the intermediary die assembly 502 is exposed to a cure process to fully cure (i.e. harden through chemical reactions and cross-linking) the insulating dielectric material of the flowable layers 518*a*, 518*b*, thus forming a cured insulating layer 519. The insulating layer 519 substantially surrounds the substrate 302 and the semiconductor dies 526 embedded therein. For example, the insulating layer 519 contacts or encapsulates at least the sides 575, 577 of the substrate 302 (including surfaces 606, 608) and at least six sides or surfaces of each semiconductor die 526, which have rectangular prism shapes as illustrated in FIG. 5I.

In one embodiment, the cure process is performed at high temperatures to fully cure the insulating layer 519. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 518 is performed at or near ambient (e.g. atmospheric) pressure conditions.

After curing, one or more through-assembly vias 503 are drilled through the intermediary die assembly 502 at operation 420, forming channels through the entire thickness of the intermediary die assembly 502 for subsequent interconnection formation. In some embodiments, the intermediary die assembly 502 may be placed on a carrier, such as the carrier 524, for mechanical support during the formation of the through-assembly vias 503 and subsequent contact holes 532. The through-assembly vias 503 are drilled through the vias 303 formed in the substrate 302 and subsequently filled with the insulating layer 519. Thus, the through-assembly vias 503 may be circumferentially surrounded by the insulating layer 519 filled within the vias 303. By having the polymer-based dielectric material of the insulating layer 519 (e.g., a ceramic-filler-containing epoxy resin material) line the walls of the vias 303, capacitive coupling between the conductive silicon-based substrate 302 and interconnections 944 (described with reference to FIG. 8 and FIGS. 9E-9H), and thus capacitive coupling between adjacently positioned vias 303 and/or redistribution connections 1144 (described with reference to FIG. 10 and FIGS. 11H-11L), in a completed 2D reconstituted substrate 900 is significantly reduced as compared to other conventional interconnecting structures that utilize conventional via insulating liners or films. Furthermore, the flowable nature of the insulating material enables more consistent and reliable encapsulation and insulation, thus enhancing electrical performance by minimizing leakage current of the completed reconstituted substrate 900.

In one embodiment, the through-assembly vias 503 have a diameter less than about 100 μm, such as less than about 75 μm. For example, the through-assembly vias 503 have a diameter less than about 60 μm, such as less than about 50 μm. In one embodiment, the through-assembly vias 503 have a diameter of between about 25 μm and about 50 μm, such as a diameter of between about 35 μm and about 40 μm. In one embodiment, the through assembly vias 503 are formed using any suitable mechanical process. For example, the through-assembly vias 503 are formed using a mechanical drilling process. In one embodiment, through-assembly vias 503 are formed through the intermediary die assembly 502 by laser ablation. For example, the through-assembly vias 503 are formed using an ultraviolet laser. In one embodiment, the laser source utilized for laser ablation has a frequency between about 5 kHz and about 500 kHz. In one embodiment, the laser source is configured to deliver a pulsed laser beam at a pulse duration between about 10 ns and about 100 ns with a pulse energy of between about 50 microjoules (μJ) and about 500 μJ. Utilizing an epoxy resin material having small ceramic filler particles for the insulating layer 519 promotes more precise and accurate laser patterning of small-diameter vias, such as the vias 503, as the small ceramic filler particles therein exhibit reduced laser light reflection, scattering, diffraction and transmission of the laser light away from the area in which the via is to be formed during the laser ablation process.

At operation 422 and FIG. 5K, one or more contact holes 532 are drilled through the insulating layer 519 to expose one or more contacts 530 formed on the active surface 528 of each embedded semiconductor die 526. The contact holes 532 are drilled through the insulating layer 519 by laser ablation, leaving all external surfaces of the semiconductor dies 526 covered and surrounded by the insulating layer 519 and the contacts 530 exposed. Thus, the contacts 530 are exposed by the formation of the contact holes 532. In one embodiment, the laser source may generate a pulsed laser beam having a frequency between about 100 kHz and about 1000 kHz. In one embodiment, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ. In one embodiment, the contact holes 532 are drilled using a $CO_2$, green, or UV laser. In one embodiment, the contact holes 532 have a diameter of between about 5 μm and about 60 μm, such as a diameter of between about 20 μm and about 50 μm.

After formation of the contact holes 532, the intermediary die assembly 502 is exposed to a de-smear process at operation 422 to remove any unwanted residues and/or debris caused by laser ablation during the formation of the through-assembly vias 503 and the contact holes 532. The de-smear process thus cleans the through-assembly vias 503 and contact holes 532 and fully exposes the contacts 530 on the active surfaces 528 of the embedded semiconductor die 526 for subsequent metallization. In one embodiment, the de-smear process is a wet de-smear process. Any suitable aqueous etchants, solvents, and/or combinations thereof may be utilized for the wet de-smear process. In one example, potassium permanganate ($KMnO_4$) solution may be utilized as an etchant. Depending on the residue thickness, exposure of the intermediary die assembly 502 to the wet de-smear process at operation 522 may be varied. In another embodiment, the de-smear process is a dry de-smear process. For example, the de-smear process may be a plasma de-smear process with an $O_2$:$CF_4$ mixture gas. The plasma de-smear process may include generating a plasma by applying a power of about 700 W and flowing $O_2$:$CF_4$ at a ratio of about 10:1 (e.g., 100:10 sccm) for a time period between about 60 seconds and about 120 seconds. In further embodiments, the de-smear process is a combination of wet and dry processes.

Following the de-smear process at operation 522, the intermediary die assembly 502 is ready for formation of interconnection paths therein and RF elements thereon, described below with reference to FIG. 8 and FIGS. 9A-9H.

As discussed above, FIG. 4 and FIGS. 5A-5K illustrate a representative method 400 for forming the intermediary die assembly 502. FIG. 6 and FIGS. 7A-7G illustrate an alternative method 600 substantially similar to the method 400 but with fewer operations. The method 600 generally includes seven operations 610-670. However, operations 610, 620, 660, and 670 of the method 600 are substantially similar to the operations 402, 404, 420, and 422 of the method 400, respectively. Thus, only operations 630, 640, and 650, depicted in FIGS. 7C, 7D, and 7E, respectively, are herein described for clarity.

Figure 7A:
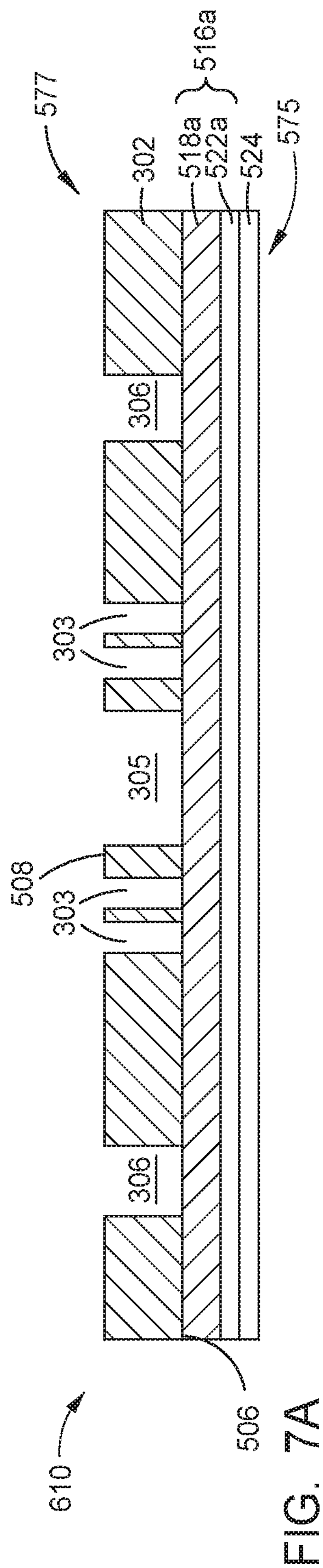
FIGS. 7A-7G schematically illustrate cross-sectional views of the intermediary die assembly at different stages of the process depicted in FIG. 6.
Figure 7B:
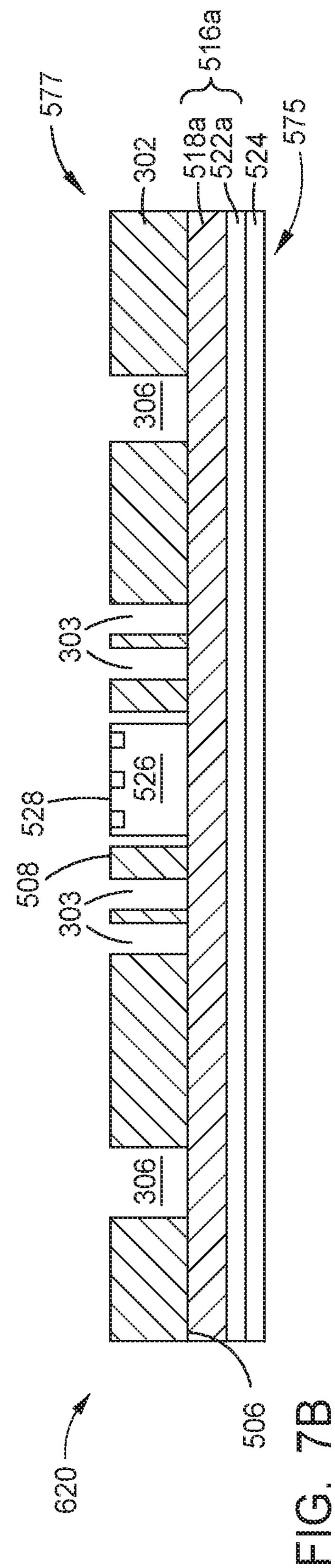
Figure 7C:
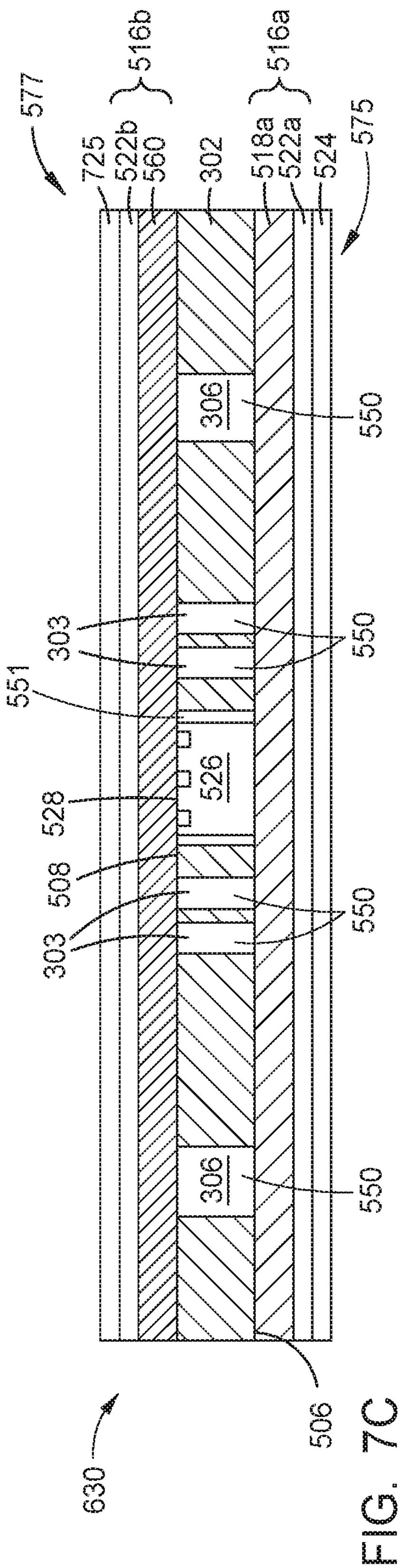

Accordingly, after placement of the one or more semiconductor dies 526 onto a surface of the insulating film 516*a* exposed through the cavities 305, the second insulating film 516*b* is positioned over the second side 577 (e.g., major surface 508) of the substrate 302 at operation 630 and FIG. 7C, prior to lamination. In some embodiments, the second insulating film 516*b* is positioned on the second side 577 of the substrate 302 such that the flowable layer 518*b* of the second insulating film 516*b* contacts and covers the active surface 528 of the semiconductor dies 526 within the primary cavities 305. In some embodiments, a second carrier 725 is affixed to the protective layer 522*b* of the second insulating film 516*b* for additional mechanical support during later processing operations. As depicted in FIG. 7C, one or more voids 550 are formed between the insulating films 516*a*, 516*b* within the vias 303 and the secondary cavities 306 and one or more gaps 551 are formed between the semiconductor dies 526 and interior walls of the primary cavities 305.

Figure 7D:
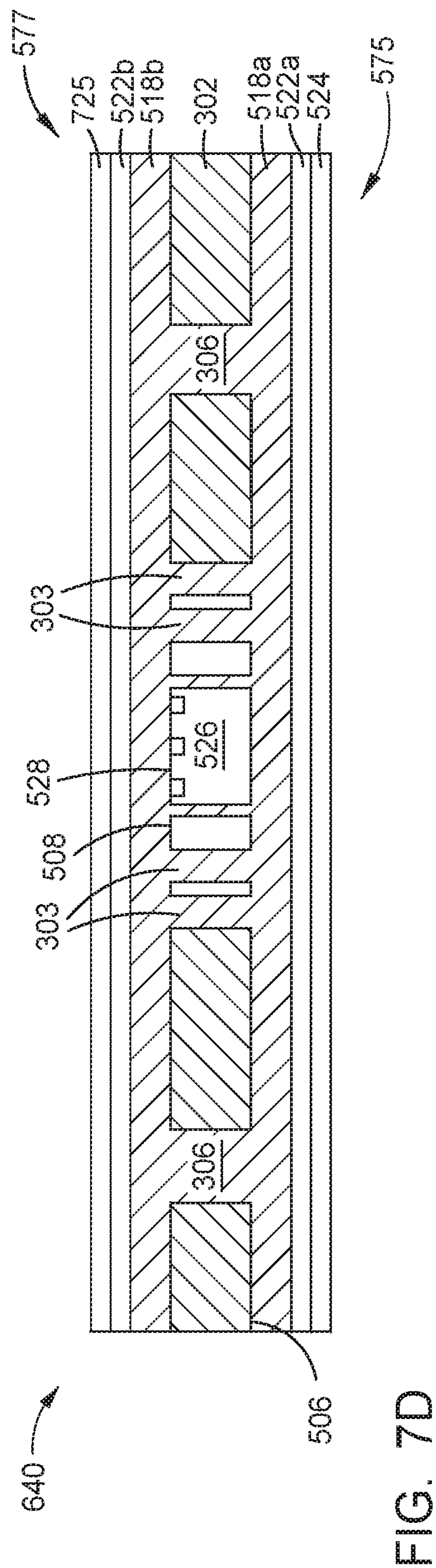

At operation 640 and FIG. 7D, the substrate 302, now affixed to the insulating films 516*a* and 516*b* and having dies 526 disposed therein, is exposed to a single lamination process. During the single lamination process, the substrate 302 is exposed to elevated temperatures, causing the flowable layers 518*a* and 518*b* of both insulating films 516*a*, 516*b* to soften and flow into the open voids 550 or gaps 551 between the insulating films 516*a*, 516*b*. Accordingly, the semiconductor dies 526 become embedded within the material of the insulating films 516*a*, 516*b*, and the vias 303 and secondary cavities 306 completely filled therewith.

Similar to the lamination processes described with reference to FIG. 4 and FIGS. 5A-5K, the lamination process at operation 640 may be a vacuum lamination process that may be performed in an autoclave or other suitable device. In another embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between about 1 psig and about 150 psig while a temperature of between about 80° C. and about 140° C. is applied to substrate 302 and insulating film 516*a*, 516*b* layers for a period between about 1 minute and about 30 minutes. For example, the lamination process is performed at a pressure of between about 10 psig and about 100 psig, a temperature of between about 100° C. and about 120° C. for a period between about 2 minutes and 10 minutes. For example, the lamination process is performed at a temperature of about 110° C. for a period of about 5 minutes.

Figure 7E:
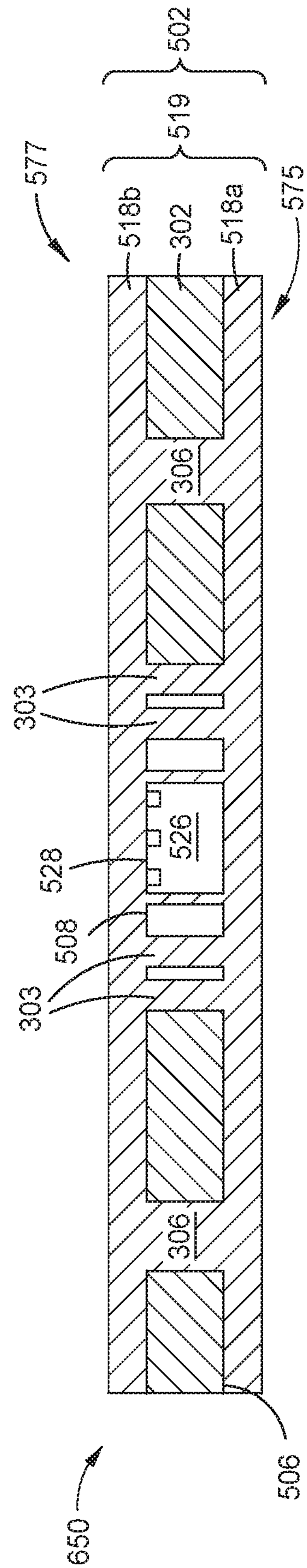
Figure 7F:
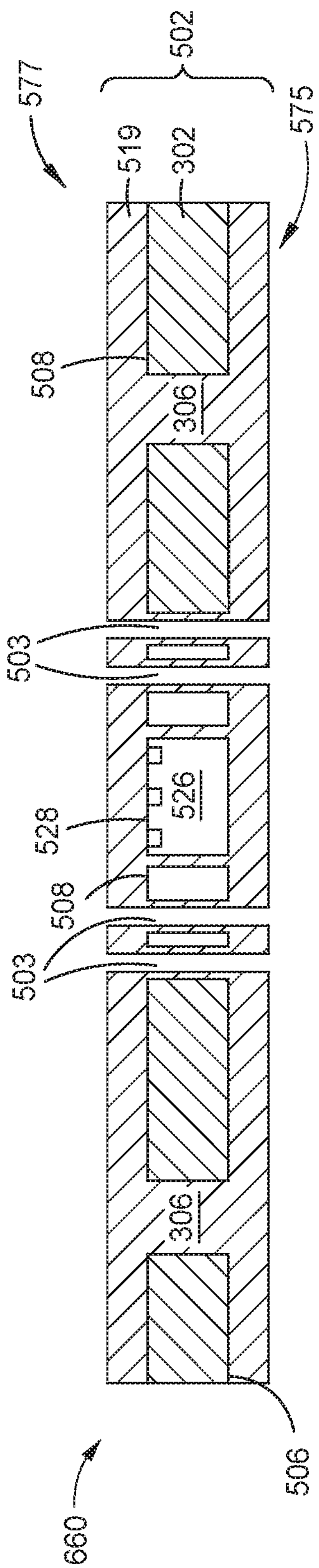
Figure 7G:
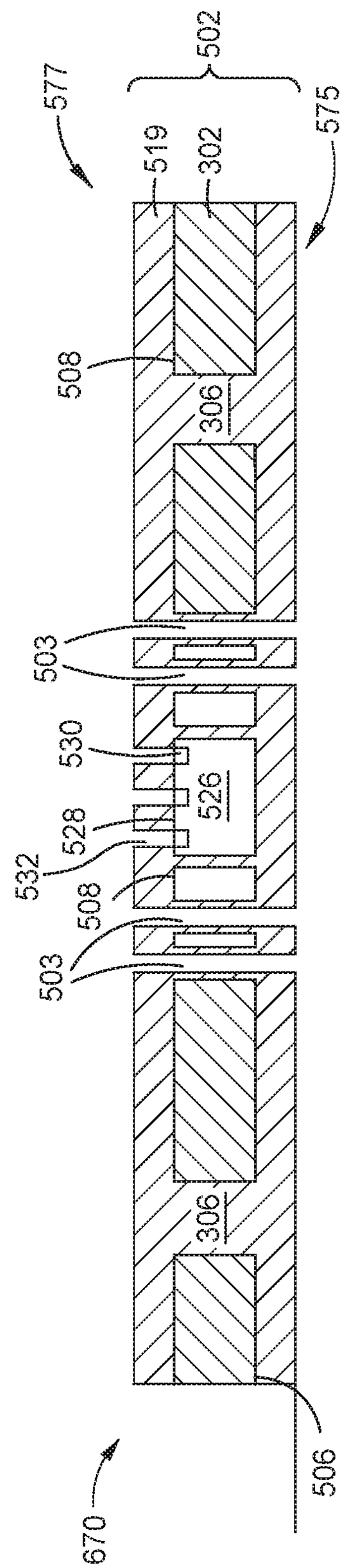

At operation 650, the one or more protective layers of the insulating films 516*a* and 516*b* are removed from the substrate 302, resulting in the laminated intermediary die assembly 502. As depicted in FIG. 7E, the intermediary die assembly 502 includes the substrate 302 having one or more primary cavities 305, secondary cavities 306, and/or vias 303 formed therein and filled with the insulating dielectric material of the flowable layers 518*a*, 518*b*, as well as the embedded dies 526 within the cavities 305. The insulating material encases the substrate 302 such that the insulating material covers at least two surfaces or sides of the substrate 302, for example major surfaces 506, 508. In one example, the protective layers 522*a*, 522*b* are removed from the intermediary die assembly 502, and thus the intermediary die assembly 502 is disengaged from the carriers 524, 725. Generally, the protective layers 522*a*, 522*b* and the carriers 524, 725 are removed by any suitable mechanical processes, such as peeling therefrom.

Upon removal of the protective layers 522*a*, 522*b*, the intermediary die assembly 502 is exposed to a cure process to fully cure the insulating dielectric material of the flowable layers 518*a*, 518*b*. Curing of the insulating material results in the formation of the cured insulating layer 519. As depicted in FIG. 7E and similar to operation 518 corresponding with FIG. 71, the insulating layer 519 substantially surrounds the substrate 302 and the semiconductor dies 526 embedded within the primary cavities 305. Furthermore, the insulating layer 519 completely fills the vias 303 and the secondary cavities 306.

In one embodiment, the cure process is performed at high temperatures to fully cure the intermediary die assembly 502. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 650 is performed at or near ambient (e.g. atmospheric) pressure conditions.

After curing at operation 650, the method 600 is substantially similar to operations 420 and 422 of the method 400. For example, the intermediary die assembly 502 has one or more through-assembly vias 503 and one or more contact holes 532 drilled through the insulating layer 519. Subsequently, the intermediary die assembly 502 is exposed to a de-smear process, after which the intermediary die assembly 502 is ready for formation of interconnection paths therein, as described below.

Figure 8:
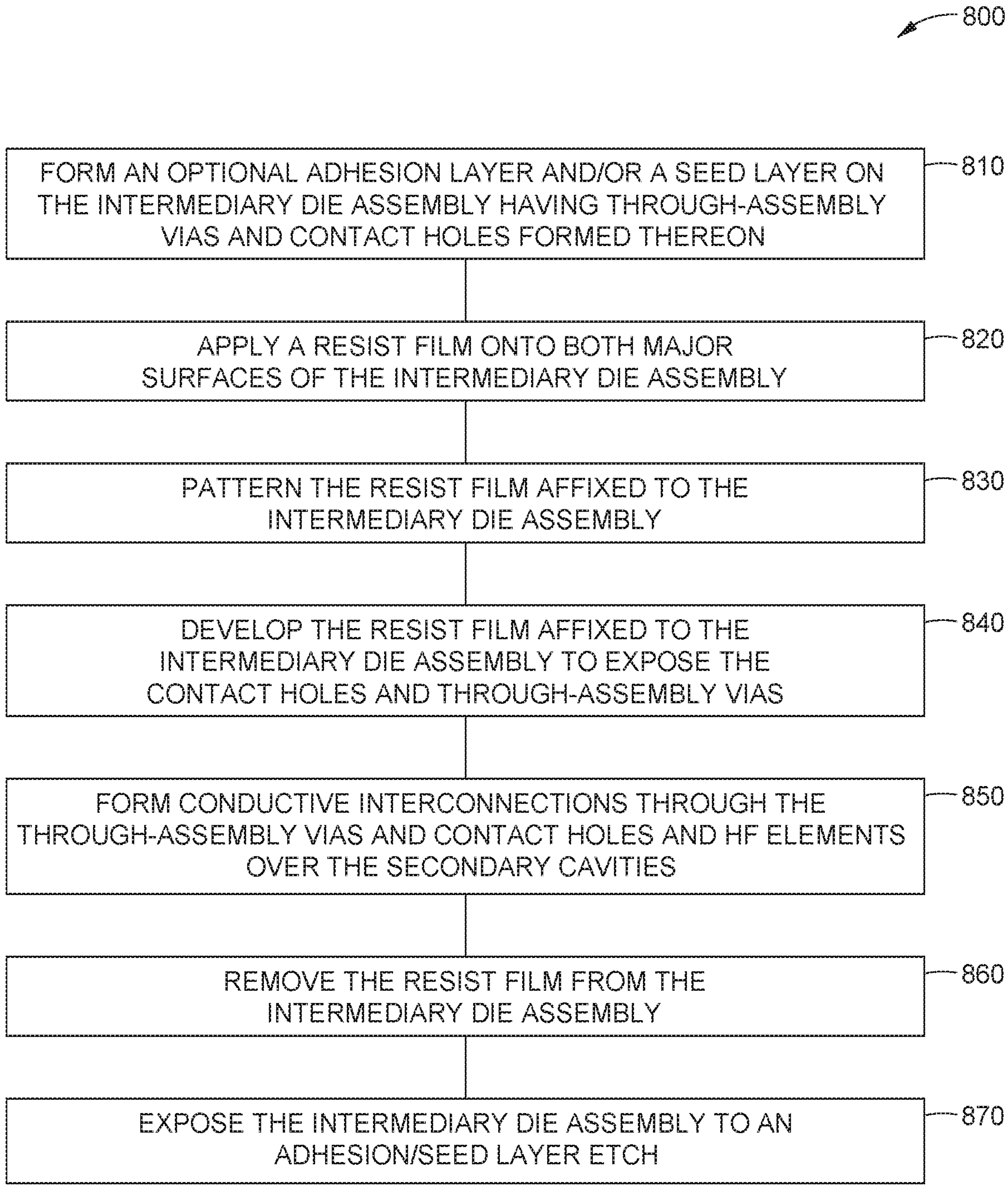
FIG. 8 illustrates a flow diagram of a process for forming interconnections and high frequency elements on an intermediary die assembly, according to embodiments described herein.

FIG. 8 illustrates a flow diagram of a representative method 800 of forming electrical interconnections between electrical components within portions of the intermediary die assembly 502 and/or the RF elements positioned thereon. FIGS. 9A-9H schematically illustrate cross-sectional views of the intermediary die assembly 502 at different stages of the process of the method 800 depicted in FIG. 8. Thus, FIG. 8 and FIGS. 9A-9H are herein described together for clarity.

Figures 9A, 9B, 9C:
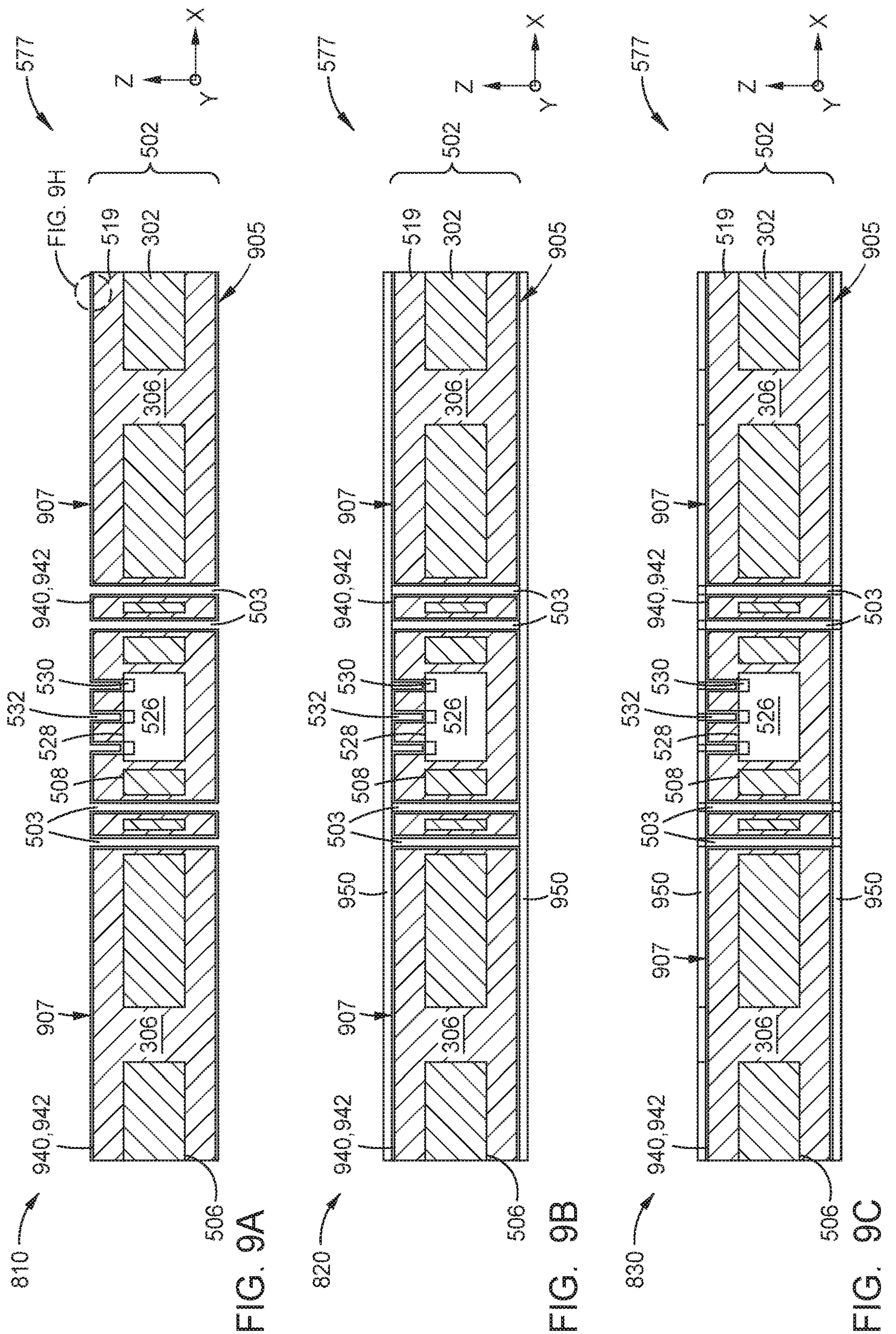
FIGS. 9A-9H schematically illustrate cross-sectional views of the intermediary die assembly at different stages of the high frequency element and interconnection formation process depicted in FIG. 8.

In one embodiment, the electrical interconnections and RF elements formed on the intermediary die assembly 502 are typically formed of copper. Thus, the method 800 may optionally begin at operation 810 and FIG. 9A wherein the intermediary die assembly 502, having through-assembly vias 503 and contact holes 532 formed therein, has an adhesion layer 940 and/or a seed layer 942 formed thereon. An enlarged partial view of the adhesion layer 940 and the seed layer 942 formed on the intermediary die assembly 502 is depicted in FIG. 9H for reference. The adhesion layer 940 may be formed on desired surfaces of the insulating layer 519 where interconnections 944 and RF elements 946 are to be subsequently deposited. For example, the adhesion layer 940 is formed on major surfaces 905, 907 of the intermediary die assembly 502, active surfaces 528 within the contact holes 532 on each semiconductor die 526, and interior walls of the through-assembly vias 503. The adhesion layer 940 assists in promoting adhesion and blocking diffusion of the subsequently formed seed layer 942, interconnections 944, and RF elements 946. Thus, in one embodiment, the adhesion layer 940 acts as an adhesion layer; in another embodiment, the adhesion layer 940 acts as a barrier layer. In both embodiments, however, the adhesion layer 940 will be hereinafter described as an "adhesion layer."

In one embodiment, the optional adhesion layer 940 is formed of titanium, titanium nitride, tantalum, tantalum nitride, manganese, manganese oxide, molybdenum, cobalt oxide, cobalt nitride, or any other suitable materials or combinations thereof. In one embodiment, the adhesion layer 940 has a thickness of between about 10 nm and about 300 nm, such as between about 50 nm and about 150 nm. For example, the adhesion layer 940 has a thickness between about 75 nm and about 125 nm, such as about 100 nm. The adhesion layer 940 is formed by any suitable deposition process, including but not limited to chemical vapor deposition (CVD), physical vapor deposition (PVD), plasma enhanced CVD (PECVD), atomic layer deposition (ALD), or the like.

The optional seed layer 942 may be formed on the adhesion layer 940 or directly on the insulating layer 519 (e.g., without the formation of the adhesion layer 940). The seed layer 942 is formed of a conductive material such as copper, tungsten, aluminum, silver, gold, or any other suitable materials or combinations thereof. In one embodiment, the seed layer 942 has a thickness between about 50 nm and about 500 nm, such as between about 100 nm and about 300 nm. For example, the seed layer 942 has a thickness between about 150 nm and about 250 nm, such as about 200 nm. In one embodiment, the seed layer 942 has a thickness of between about 0.1 μm and about 1.5 μm. Similar to the adhesion layer 940, the seed layer 942 is formed by any suitable deposition process, such as CVD, PVD, PECVD, ALD dry processes, wet electroless plating processes, or the like. In one embodiment, a molybdenum adhesion layer 940 is formed on the intermediary die assembly in combination with a copper seed layer 942. The Mo—Cu adhesion and seed layer combination enables improved adhesion with the surfaces of the insulating layer 519 and reduces undercut of conductive interconnect lines during a subsequent seed layer etch process at operation 870.

At operations 820 and 830, corresponding to FIGS. 9B and 9C, respectively, a spin-on/spray-on or dry resist film 950, such as a photoresist, is applied on both major surfaces 905, 907 of the intermediary die assembly 502 and is subsequently patterned. In one embodiment, the resist film 950 is patterned via selective exposure to UV radiation. In one embodiment, an adhesion promoter (not shown) is applied to the intermediary die assembly 502 prior to formation of the resist film 950. The adhesion promoter improves adhesion of the resist film 950 to the intermediary die assembly 502 by producing an interfacial bonding layer for the resist film 950 and by removing any moisture from the surface of the intermediary die assembly 502. In some embodiments, the adhesion promoter is formed of bis(trimethylsilyl)amine or hexamethyldisilazane (HMDS) and propylene glycol monomethyl ether acetate (PGMEA).

Figure 9D:
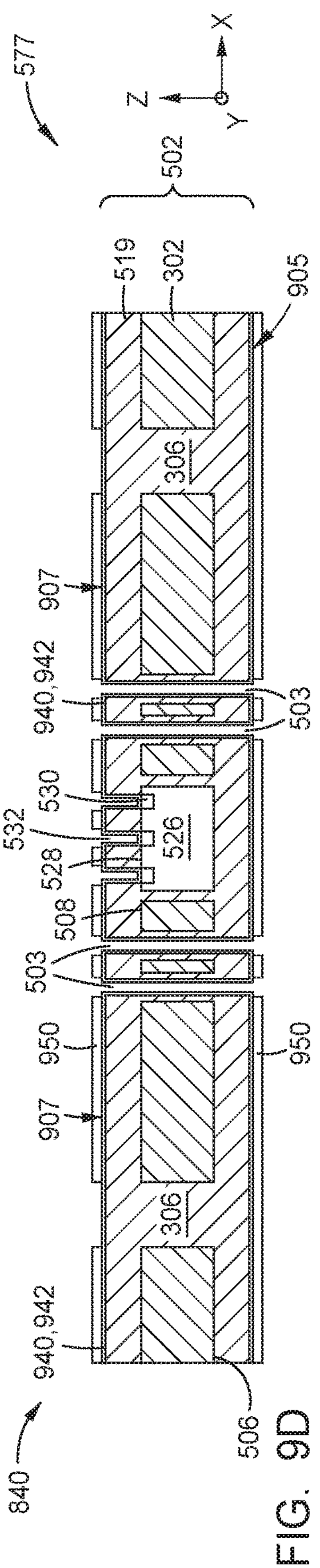

At operation 840 and FIG. 9D, the intermediary die assembly 502 is exposed to a resist film development process. As depicted in FIG. 9D, development of the resist film 950 results in exposure of the through-assembly vias 503, contact holes 532, and regions of the major surfaces 905, 907 adjacent the secondary cavities 306 upon which the RF elements are to be formed. In one embodiment, the film development process is a wet process, such as a wet process that includes exposing the resist to a solvent. In one embodiment, the film development process is a wet etch process utilizing an aqueous etch process. In other embodiments, the film development process is a wet etch process utilizing a buffered etch process selective for a desired material. Any suitable wet solvents or combination of wet etchants may be used for the resist film development process.

Figure 9E:
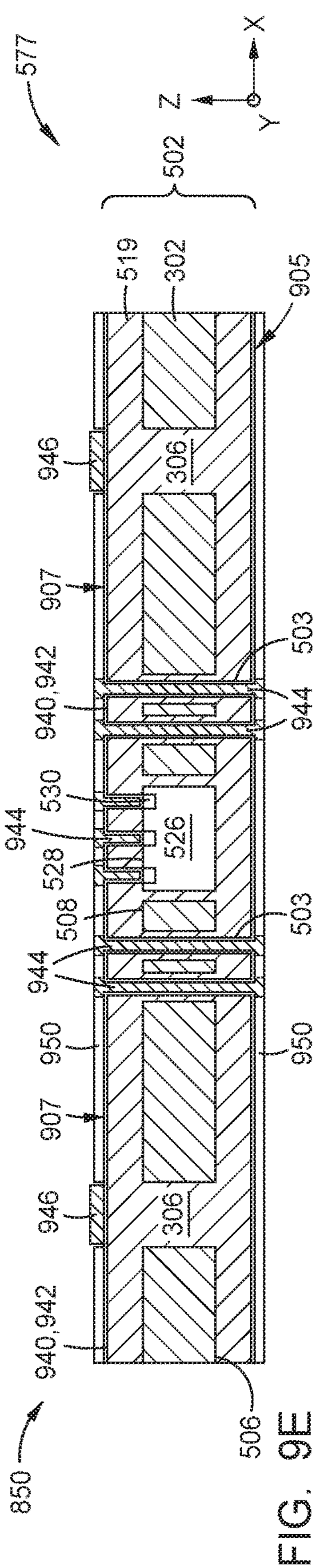

At operation 850 and corresponding with FIG. 9E, interconnections 944 are formed through the exposed through-assembly vias 503 and contact holes 532 and RF elements 946 are formed over the exposed regions of the major surfaces 905, 907. The interconnections 944 and RF elements 946 will include a conductive layer that is formed by any suitable methods including electroplating and electroless deposition or electroless plating. In one example, the interconnections 944 and/or RF elements 946 are formed of copper. In other examples, the interconnections 944 and/or RF elements are formed of another suitable conductive material, including but not limited to aluminum, gold, nickel, silver, palladium, tin, or the like.

The interconnections 944 may completely fill the through-assembly vias 503 and contact holes 532 or only cover inner circumferential walls thereof. For example, the interconnections 944 may line the inner circumferential walls of the through-assembly vias 503 and have hollow cores. In some embodiments, the interconnections 944 protrude from one or both of the major surfaces 905, 907, as depicted in FIG. 9E.

The RF elements 946 may include any suitable components for utilization with wireless network devices and systems, including 4G, 5G, and 6G systems. For example, the RF elements 946 may include antenna patches, capacitors, inductors, resistors, and the like. In some embodiments, the RF elements 946 remain exposed upon completion of the reconstituted substrate 900. In other embodiments, the RF elements 946 become embedded within the reconstituted substrate 900 upon formation of one or more additional redistribution layers thereon (e.g., redistribution layers 1158, 1160 discussed below). In some embodiments, the RF elements 946 will include a metal containing layer that has a desired shape (e.g., shape in the X-Y plane, which is parallel to the major surface 907) to facilitate the creation of a RF communication element. In one example, one or more of the RF elements 946 have a shape that is configured to form at least a portion of a monopole, dipole, loop, aperture (e.g., slotted, inverted-F) or array type of RF antenna. The shape of the formed RF elements 946 may be created during the patterning of the resist film 950 process performed during operations 820-840 and subsequent metallization process(es) performed during operation 850. As depicted, the RF elements 946 are formed over the secondary cavities 306, now filled with the dielectric material of the insulating layer 519. Accordingly, by forming the RF elements 946 over the insulating layer 519 and not the substrate 302, any radiation loss caused by the conductive nature of the substrate 302 is limited, resulting in improved radiation efficiency of the RF element 946.

Figure 9F:
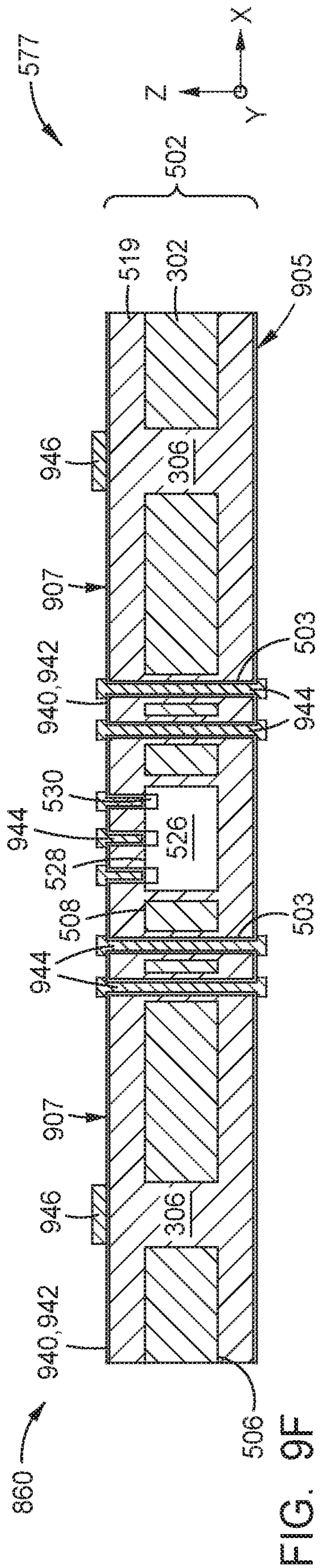
Figure 9G:
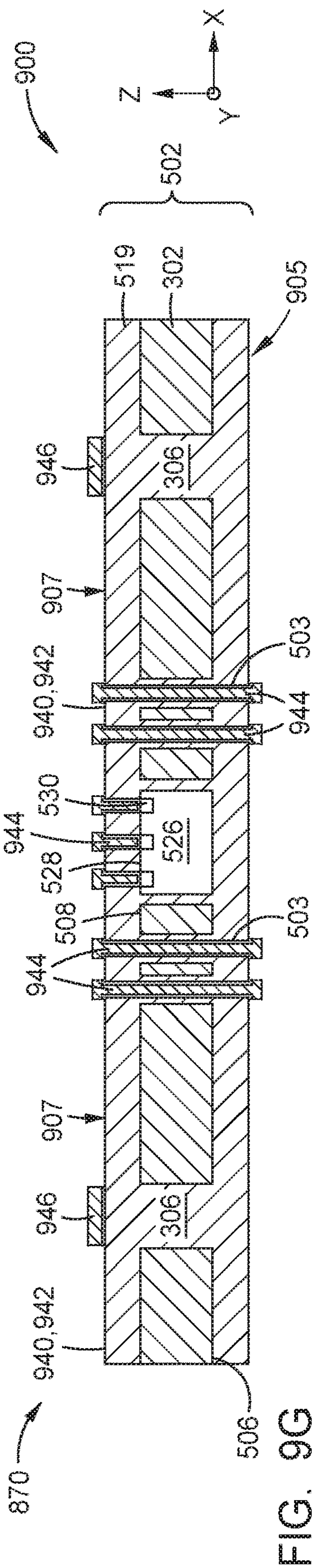
Figure 9H:
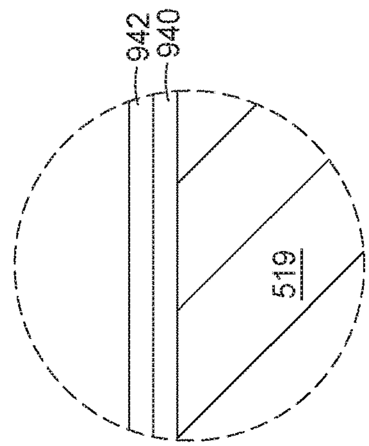

Upon formation of the interconnections 944 and RF elements 946, the resist film 950 is removed at operation 860 and the intermediary die assembly 502 is exposed to an adhesion and/or seed layer etch process at operation 970, corresponding with FIGS. 9F and 9G, respectively. The etch process at operation 970 results in removal of exposed regions of the adhesion layer 940 and the seed layer 942, thus resulting in formation of the reconstituted substrate 900. In one embodiment, the seed layer etch is a wet etch process including a rinse and drying of the intermediary die assembly 502. In one embodiment, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

In some embodiments, upon the completion of operations 820-860, one or more contacts 530 that are coupled to the semiconductor die 526 are further coupled to one or more of the RF elements 946 by a lateral trace region (not shown) of the one or more contacts 530. The lateral trace region can include a portion of the conductive layer formed in operation 850 and is used to electrically connect an RF element 946 to at least one of the one or more contacts 530. The lateral trace region will typically extend across a portion of the major surface 907, between the RF element 946 and the at least one of the one or more contacts 530.

Following the adhesion and/or seed layer etch process at operation 870, the reconstituted substrate 900 may be singulated into one or more electrically functioning packages or SiPs, and thereafter integrated with other semiconductor devices and packages in various 2D and 3D arrangements and architectures. For example, the packages or SiPs may be vertically stacked with additional packages or SiPs and/or other semiconductor devices and systems to form homogeneous or heterogeneous 3D stacked systems. Alternatively, the reconstituted substrate 900 may be integrated with additional semiconductor devices and systems prior to singulation.

In yet another embodiment, upon etching of the adhesion and/or seed layer, the reconstituted substrate 900 may have one or more redistribution layers 1158, 1160 (shown in FIGS. 11K-11L) formed thereon as needed to enable rerouting and/or extension of contact points of the interconnections 944 to desired locations on the surfaces of the reconstituted substrate 900. Formation of the redistribution layers 1158, 1160 may also embed the RF elements 946 within dielectric material, thus improving the integration density of subsequently-singulated packages by replacing larger RF passive elements with smaller embedded RF elements. Furthermore, embedding the RF elements 946 may improve system performance, as passive RF elements are placed closer to front-end devices as compared to off-chip passive RF elements, which are typically integrated further therefrom. Thus, the overall length of interconnections is reduced, minimizing losses due to lengthy interconnections.

Figure 10:
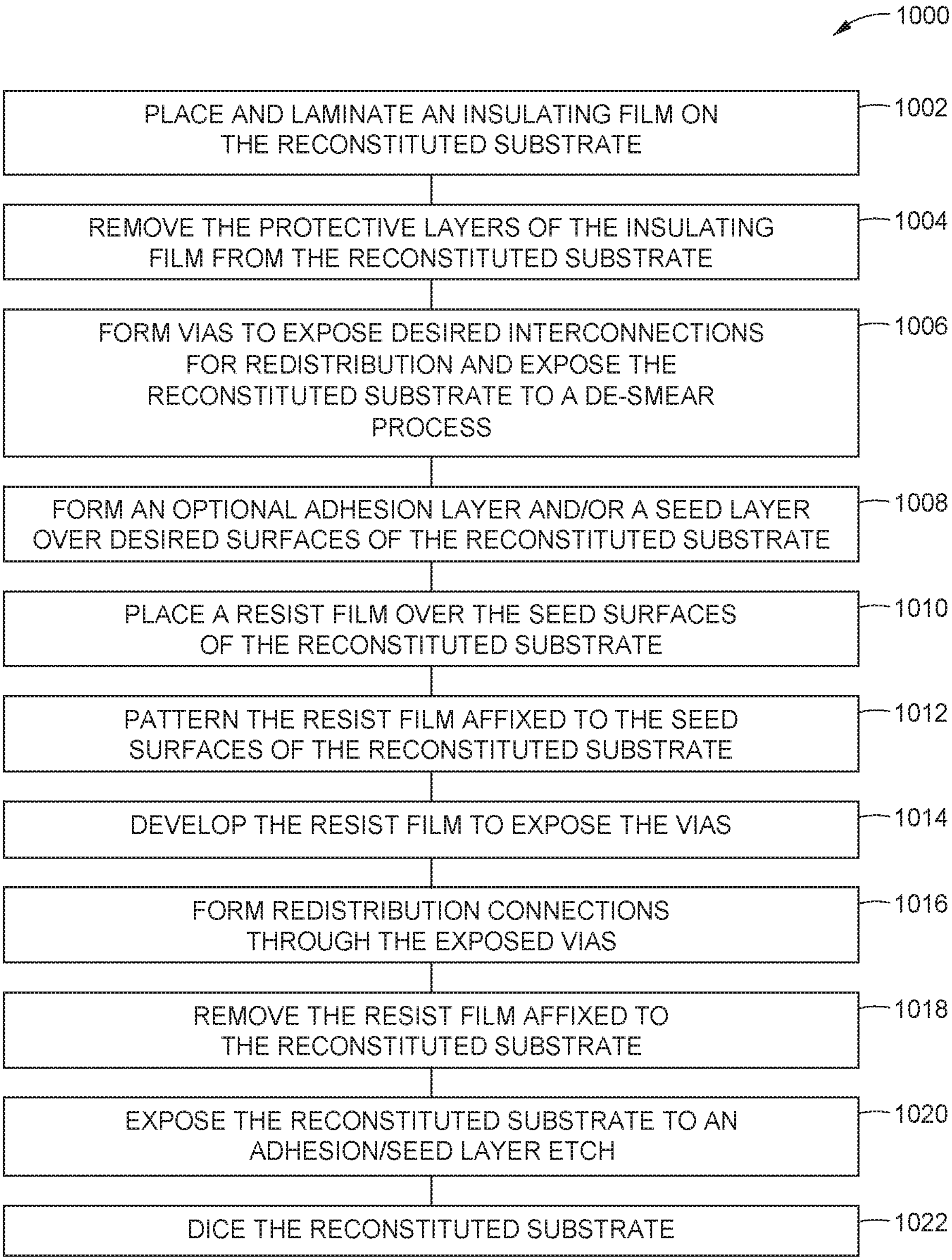
FIG. 10 illustrates a flow diagram of a process for forming a redistribution layer on reconstituted substrate followed by singulation, according to embodiments described herein.

FIG. 10 illustrates a flow diagram of a representative method 1000 of forming a redistribution layer 1158 on the reconstituted substrate 900. FIGS. 11A-11L schematically illustrate cross-sectional views of the reconstituted substrate 900 at different stages of the method 1000, depicted in FIG. 10. Thus, FIG. 10 and FIGS. 11A-11L are herein described together for clarity.

The method 1000 is substantially similar to the methods 400, 600, and 800 described above. Generally, the method 1000 begins at operation 1002 and FIG. 11A, wherein an insulating film 1116 is placed on the reconstituted substrate 900, already having the insulating layer 519 formed thereon, and thereafter laminated. The insulating film 1116 may be substantially similar to the insulating films 516 and may include one or more flowable layers 1118 formed of flowable and polymer-based dielectric materials and one or more protective layers 1122 formed of PET.

In one embodiment, the flowable layer 1118 includes an epoxy resin material. In one embodiment, the flowable layer 1118 includes a ceramic-filler-containing epoxy resin material. In another embodiment, the flowable layer 1118 includes a photodefinable polyimide material. The material properties of photodefinable polyimide enable the formation of smaller (e.g., narrower) vias through the resulting interconnect redistribution layer formed from the insulating film 1116. However, any suitable combination of flowable layers 1118 and insulating materials is contemplated for the insulating film 1116. For example, the insulating film 1116 may include one or more flowable layers 1118 including a non-photosensitive polyimide material, a polybenzoxazole (PBO) material, a silicon dioxide material, and/or a silicon nitride material.

In some examples, the material of the flowable layer 1118 is different from the flowable layers 518 of the insulating films 516. For example, the flowable layers 518 may include a ceramic-filler-containing epoxy resin material and the flowable layer 1118 may include a photodefinable polyimide material. In another example, the flowable layer 1118 includes a different inorganic dielectric material from the flowable layers 518. For example, the flowable layers 518 may include a ceramic-filler-containing epoxy resin material and the flowable layer 1118 may include a silicon dioxide material.

The insulating film 1116 has a total thickness of less than about 120 μm, such as between about 40 μm and about 100 μm. For example, the insulating film 1116 including the flowable layer 1118 and the protective layer 1122 has a total thickness of between about 50 μm and about 90 μm. In one embodiment, the flowable layer 1118 has a thickness of less than about 60 μm, such as a thickness between about 5 μm and about 50 μm, such as a thickness of about 20 μm. The insulating film 1116 is placed on a surface of the reconstituted substrate 900 having exposed interconnections 944 that are coupled to the contacts 530 on the active surface 528 of semiconductor dies 526 and/or coupled to the metallized through-assembly vias 503, such as the major surface 907.

After placement of the insulating film 1116, the reconstituted substrate 900 is exposed to a lamination process substantially similar to the lamination process described with reference to operations 408, 416, and 640. The reconstituted substrate 900 is exposed to elevated temperatures to soften the flowable layer 1118, which subsequently bonds to the insulating layer 519 already formed on the reconstituted substrate 900. Thus, in one embodiment, the flowable layer 1118 becomes integrated with the insulating layer 519 and forms an extension thereof. The integration of the flowable layer 1118 and the insulating layer 519 results in an expanded insulating layer 519, covering the previously exposed interconnections 944. Accordingly, the bonded flowable layer 1118 and the insulating layer 519 will herein be jointly described as the insulating layer 519. In other embodiments, however, the lamination and subsequent curing of the flowable layer 1118 forms a second insulating layer (not shown) on the insulating layer 519. In some examples, the second insulating layer is formed of a different material layer than the insulating layer 519.

In one embodiment, the lamination process is a vacuum lamination process that may be performed in an autoclave or other suitable device. In one embodiment, the lamination process is performed by use of a hot pressing process. In one embodiment, the lamination process is performed at a temperature of between about 80° C. and about 140° C. and for a period between about 1 minute and about 30 minutes. In some embodiments, the lamination process includes the application of a pressure of between 10 psig and about 100 psig while a temperature of between about 80° C. and about 140° C. is applied to the substrate 302 and insulating film 1116 for a period between about 1 minute and about 30 minutes. For example, the lamination process is performed at a pressure of between about 30 psig and about 80 psig and a temperature of between about 100° C. and about 120° C. for a period between about 2 minutes and about 10 minutes. For example, the lamination process is performed at a temperature of about 110° C. for a period of about 5 minutes. In further examples, the lamination process is performed at a pressure between about 30 psig and about 70 psig, such as about 50 psig.

Figures 11A, 11B, 11C:
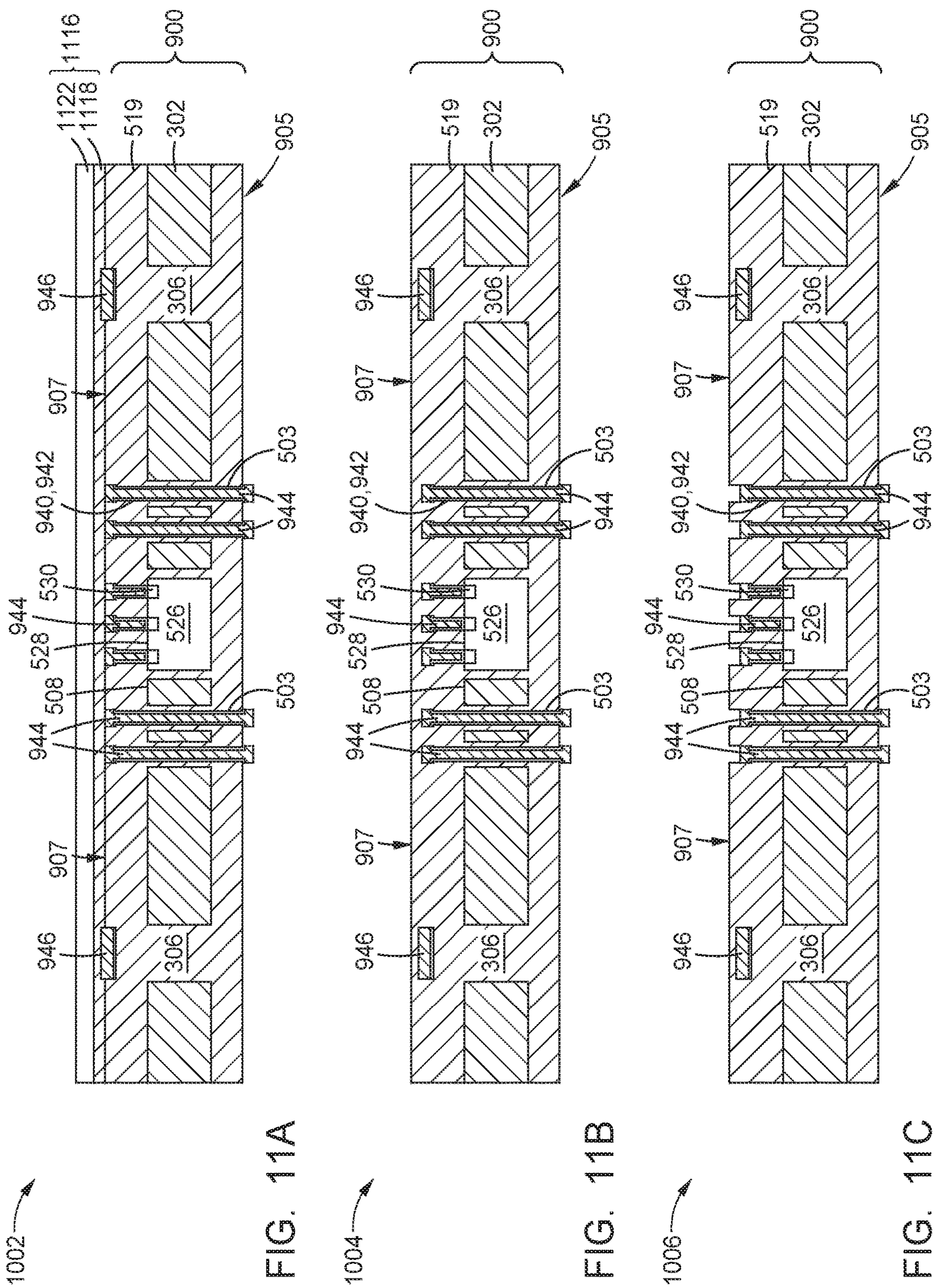
FIGS. 11A-11L schematically illustrate cross-sectional views of a reconstituted substrate at different stages of forming a redistribution layer followed by singulation, as depicted in FIG. 10.

At operation 1004 and FIG. 11B, the protective layer 1122 is removed from the reconstituted substrate 900 by mechanical processes. After removal of the protective layer 1122, the reconstituted substrate 900 is exposed to a cure process to fully cure the newly expanded insulating layer 519. In one embodiment, the cure process is substantially similar to the cure process described with reference to operations 418 and 650. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 1004 is performed at or near ambient pressure conditions.

The reconstituted substrate 900 is then selectively patterned by laser ablation at operation 1006 and FIG. 11C. The laser ablation at operation 1006 forms redistribution vias 1103 through the newly expanded insulating layer 519 and exposes desired interconnections 944 for redistribution of contact points thereof. In one embodiment, the redistribution vias 1103 have a diameter of between about 1 μm and about 70 μm, such as between about 2 μm and about 60 μm, such as a diameter of between about 10 μm and about 50 μm, such as between about 20 μm and about 45 μm. In one embodiment, the laser ablation process at operation 1006 is performed utilizing a $CO_2$ laser. In one embodiment, the laser ablation process is performed utilizing a UV laser. In one embodiment, the laser ablation process is performed utilizing a green laser. The laser source at operation 1006 may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ. The laser ablation at operation 1006 may also be used to form an optional RF element via (not shown) that extends between the top surface of the reconstituted substrate 900 and a region of an RF element 946 to enable the connection of an RF element 946 to a semiconductor die 526 or external electronic device (not shown).

In alternative embodiments, the patterning of the reconstituted substrate 900 at operation 1006 is performed using a plasma surface modification process, such as a plasma dry etch process utilizing fluorocarbon, $O_2$, $NH_3$, $N_2$, He, $O_{12}$, and/or Ar reactive gases.

Upon patterning thereof, the reconstituted substrate 900 is exposed to a de-smear process substantially similar to the de-smear process at operations 422 and 670. During the de-smear process at operation 1006, any unwanted residues and debris formed by laser ablation during the formation of the redistribution vias 1103 are removed from the redistribution vias 1103 to clear (e.g., clean) the surfaces thereof for subsequent metallization. In one embodiment, the de-smear process is a wet process. Any suitable aqueous etchants, solvents, and/or combinations thereof may be utilized for the wet de-smear process. In one example, $KMnO_4$ solution may be utilized as an etchant. In another embodiment, the de-smear process is a dry de-smear process. For example, the de-smear process may be a plasma de-smear process with an $O_2/CF_4$ mixture gas. In further embodiments, the de-smear process is a combination of wet and dry processes.

Figure 11D:
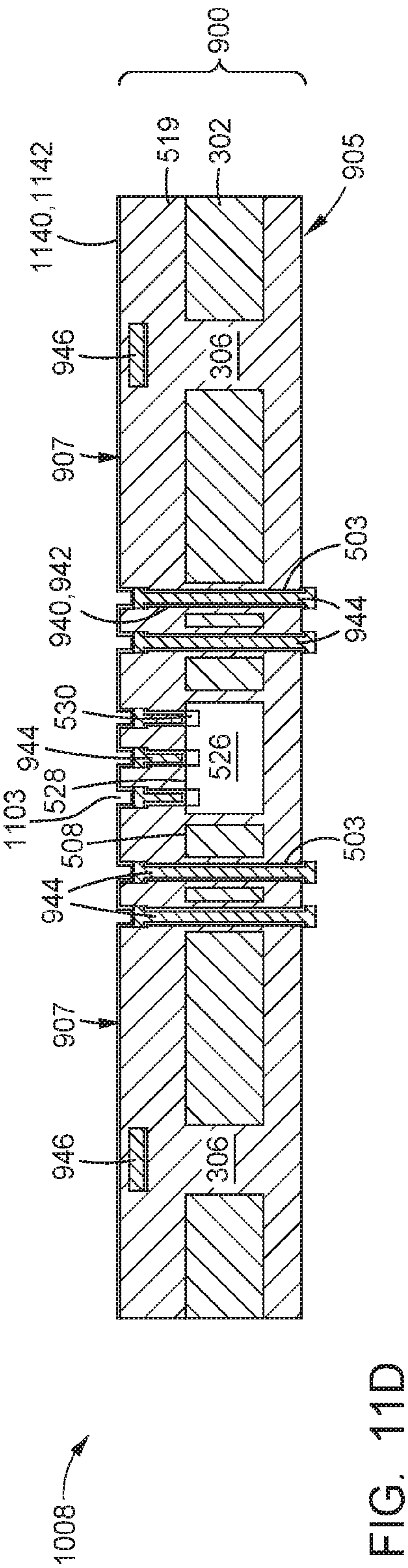

At operation 1008 and FIG. 11D, an optional adhesion layer 1140 and/or seed layer 1142 are formed on the insulating layer 519. In one embodiment, the adhesion layer 1140 is formed from titanium, titanium nitride, tantalum, tantalum nitride, manganese, manganese oxide, molybdenum, cobalt oxide, cobalt nitride, or any other suitable materials or combinations thereof. In one embodiment, the adhesion layer 1140 has a thickness of between about 10 nm and about 300 nm, such as between about 50 nm and about 150 nm. For example, the adhesion layer 1140 has a thickness between about 75 nm and about 125 nm, such as about 100 nm. The adhesion layer 1140 may be formed by any suitable deposition process, including but not limited to CVD, PVD, PECVD, ALD, or the like.

The optional seed layer 1142 is formed from a conductive material such as copper, tungsten, aluminum, silver, gold, or any other suitable materials or combinations thereof. In one embodiment, the seed layer 1142 has a thickness between about 50 nm and about 500 nm, such as between about 100 nm and about 300 nm. For example, the seed layer 1142 has a thickness between about 150 nm and about 250 nm, such as about 200 nm. In one embodiment, the seed layer 1142 has a thickness of between about 0.1 μm and about 1.5 μm. Similar to the adhesion layer 1140, the seed layer 1142 may be formed by any suitable deposition process, such as CVD, PVD, PECVD, ALD dry processes, wet electroless plating processes, or the like. In one embodiment, a molybdenum adhesion layer 1140 and a copper seed layer 1142 are formed on the reconstituted substrate 900 to reduce undercut of conductive interconnect lines during a subsequent seed layer etch process at operation 1020.

Figure 11E:
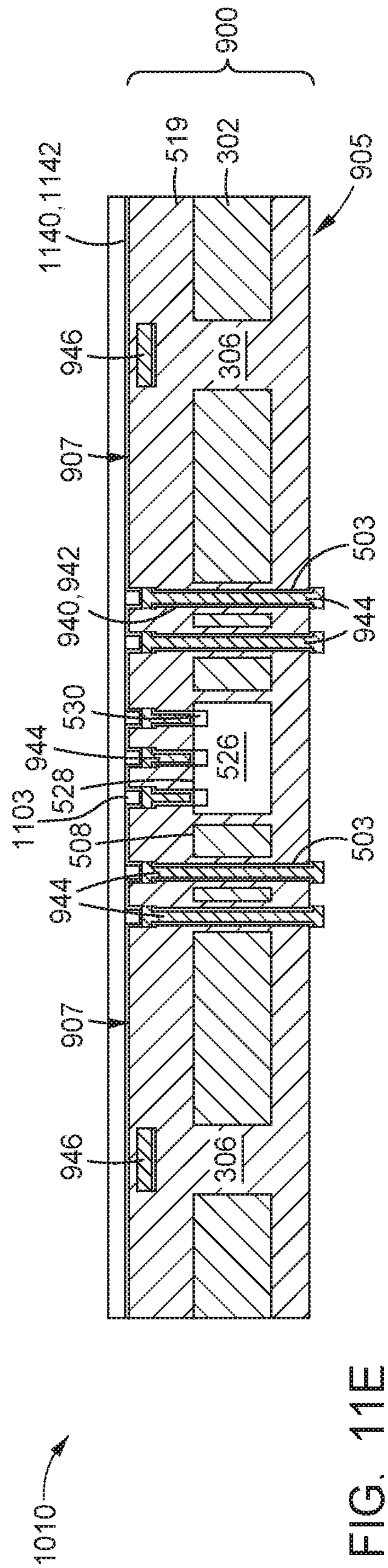
Figure 11F:
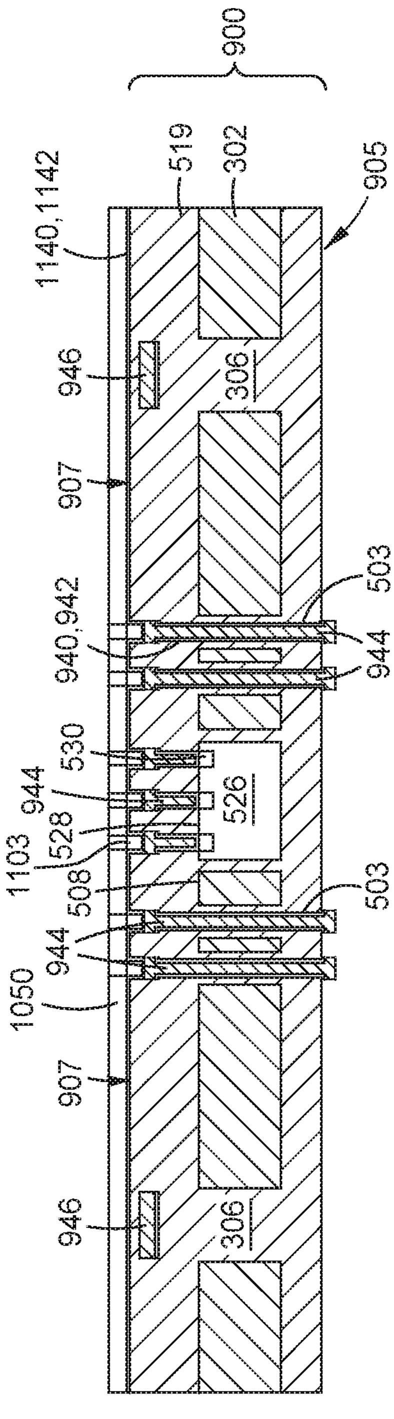
Figure 11G:
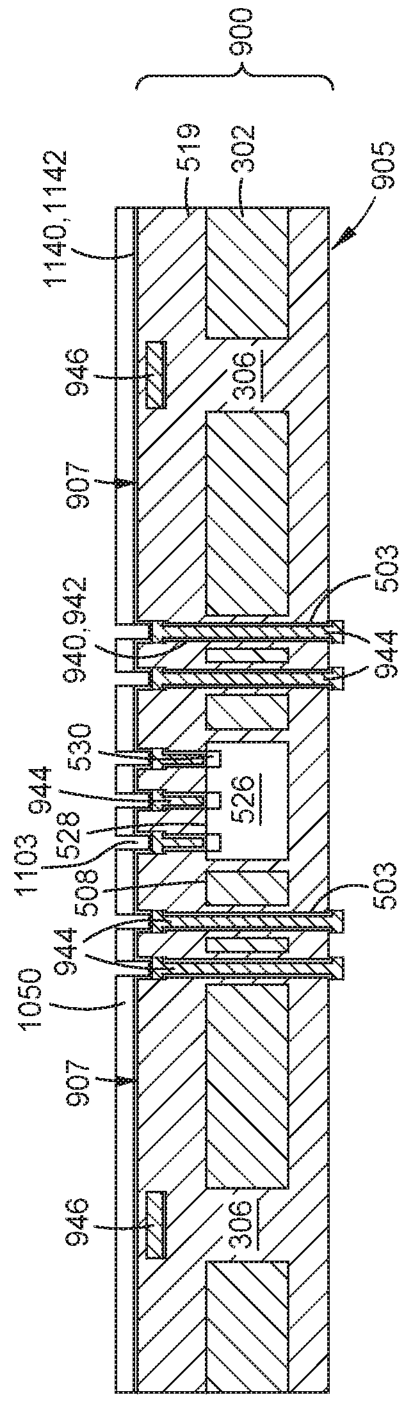

At operations 1010, 1012, and 1014, corresponding to FIGS. 11E, 11F, and 11G respectively, a spin-on/spray-on or dry resist film 1150, such as a photoresist, is applied over the adhesion and/or seed surfaces of the reconstituted substrate 900 and subsequently patterned and developed. In one embodiment, an adhesion promoter (not shown) is applied to the reconstituted substrate 900 prior to placement of the resist film 1150. The exposure and development of the resist film 1150 results in the opening of the redistribution vias 1103. Thus, patterning of the resist film 1150 may be performed by selectively exposing portions of the resist film 1150 to UV radiation and subsequent development of the resist film 1150 by a wet process, such as a wet etch process. In one embodiment, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

Figure 11H:
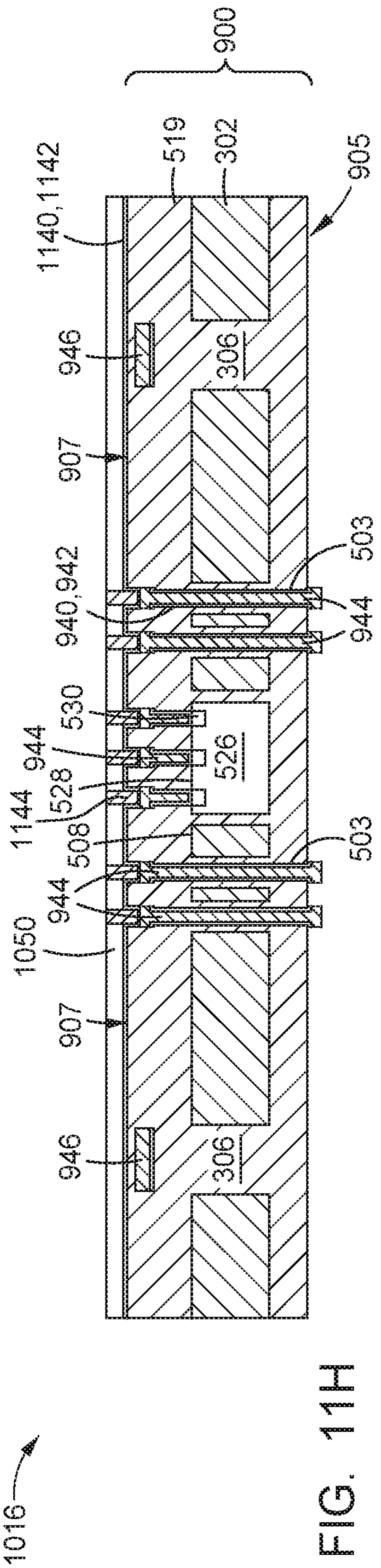
Figure 11I:
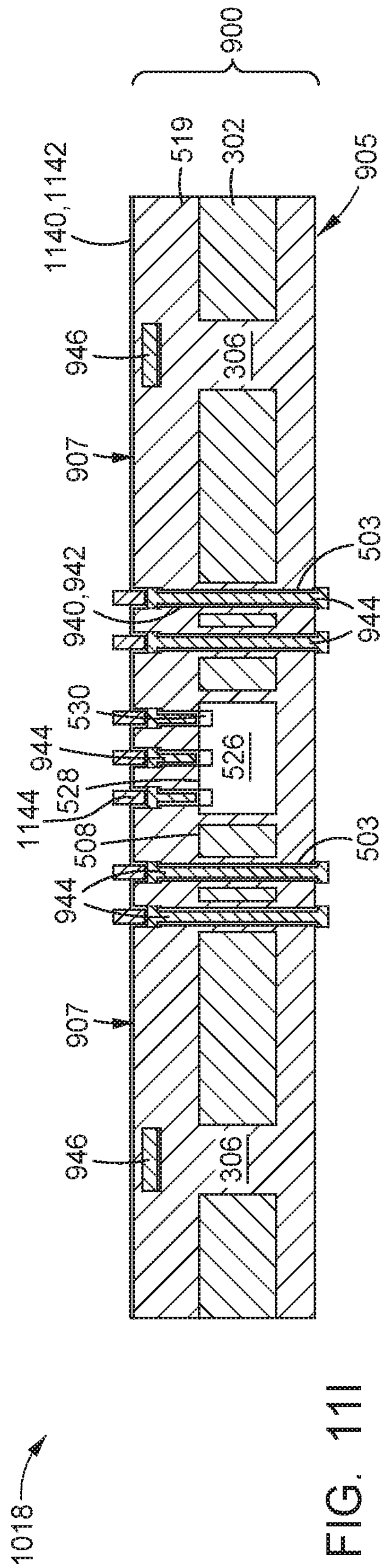

At operations 1016 and 1018, corresponding to FIGS. 11H and 11I respectively, redistribution connections 1144 are formed through the exposed redistribution vias 1103 and the resist film 1150 is thereafter removed. The redistribution connections 1144, which include a conductive layer, are formed by any suitable methods, including electroplating and electroless deposition. In one embodiment, the resist film 1150 is removed via a wet process. As depicted in FIGS. 11H and 11I, the redistribution connections 1144 fill the redistribution vias 1103 and protrude from the surfaces of the reconstituted substrate 900 upon removal of the resist film 1150. In one embodiment, the redistribution connections 1144, and optional RF element vias, are formed of copper. In other embodiments, the redistribution connections 1144 may be formed of any suitable conductive material including but not limited to aluminum, gold, nickel, silver, palladium, tin, or the like.

Figure 11J:
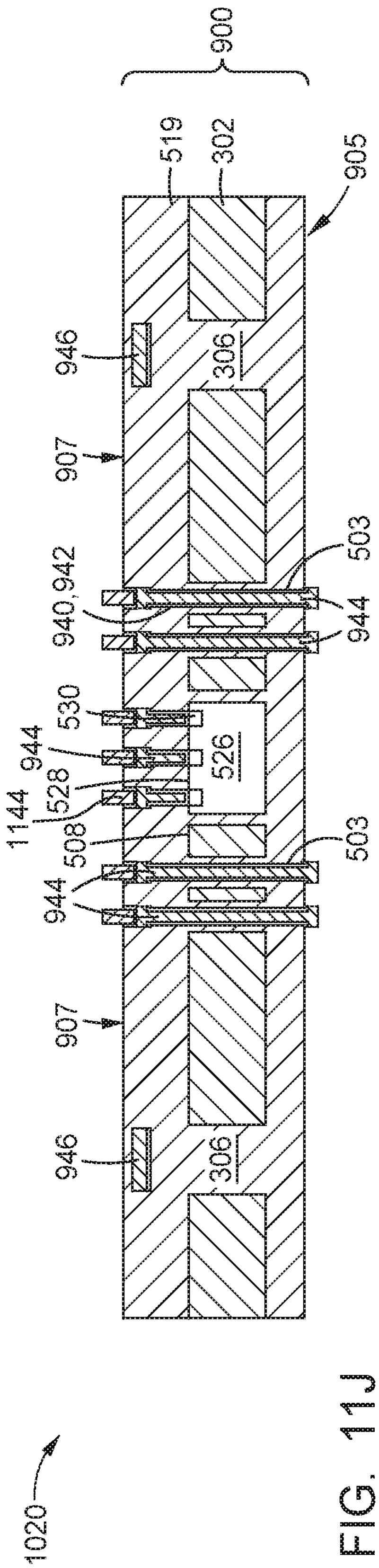

At operation 1020 and FIG. 11J, the reconstituted substrate 900 having the redistribution connections 1144 formed thereon is exposed to a seed layer etch process substantially similar to that of operation 870. In one embodiment, the seed layer etch is a wet etch process, including a rinse and drying of the reconstituted substrate 900. In one embodiment, the seed layer etch process is a wet etch process utilizing a buffered etch process selective for a desired material of the seed layer 1142. In other embodiments, the etch process is a wet etch process utilizing an aqueous etch process. Any suitable wet etchant or combination of wet etchants may be used for the seed layer etch process.

Figure 11K:
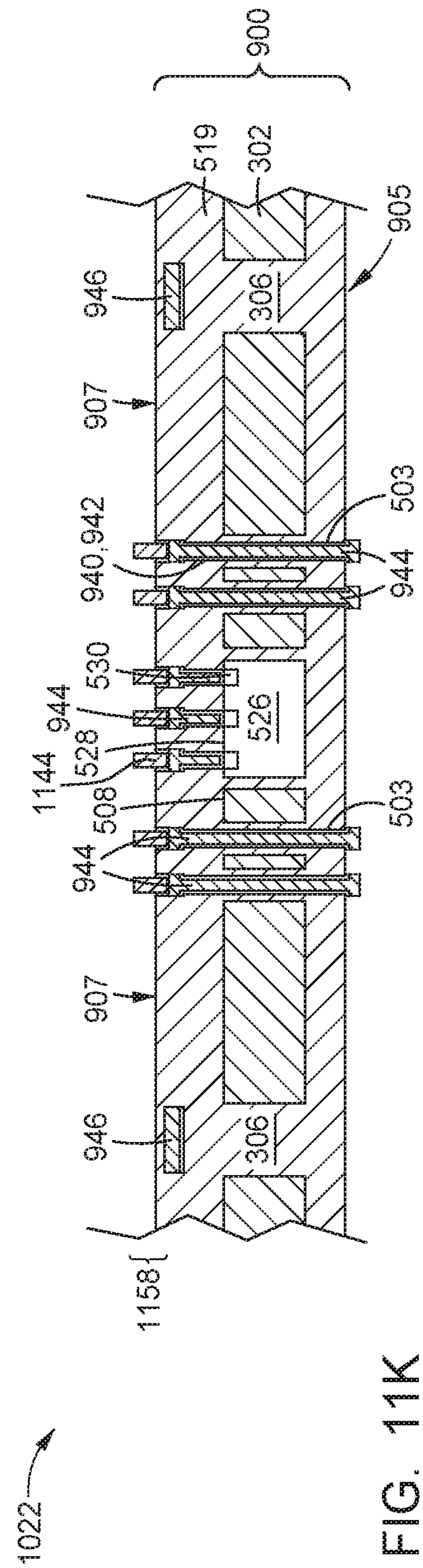
Figure 11L:
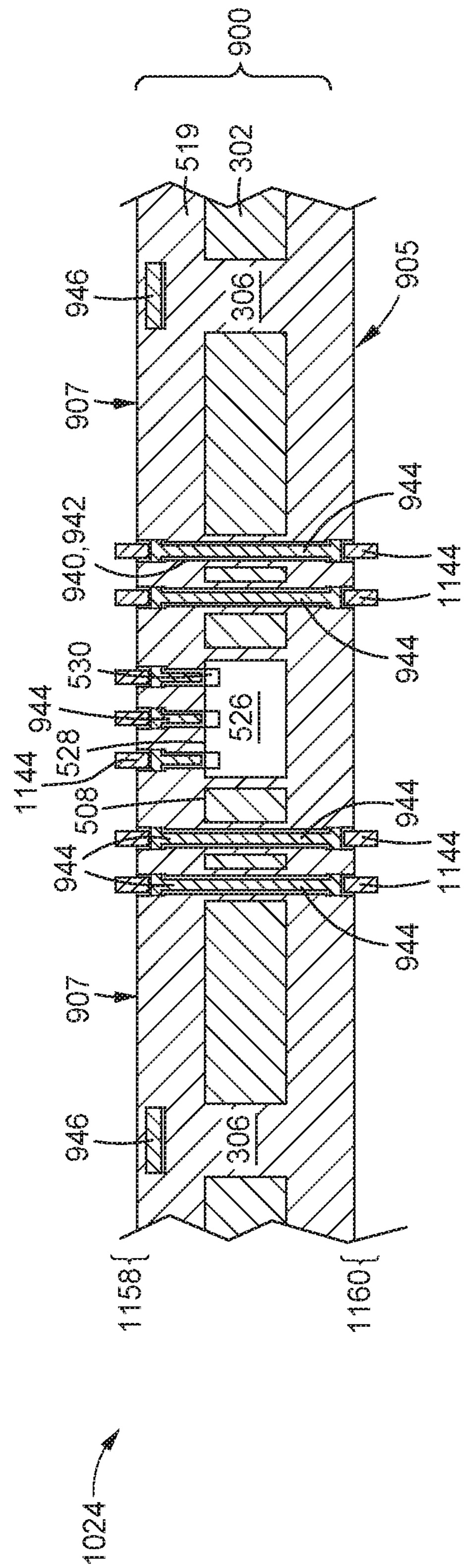
Figure 12:
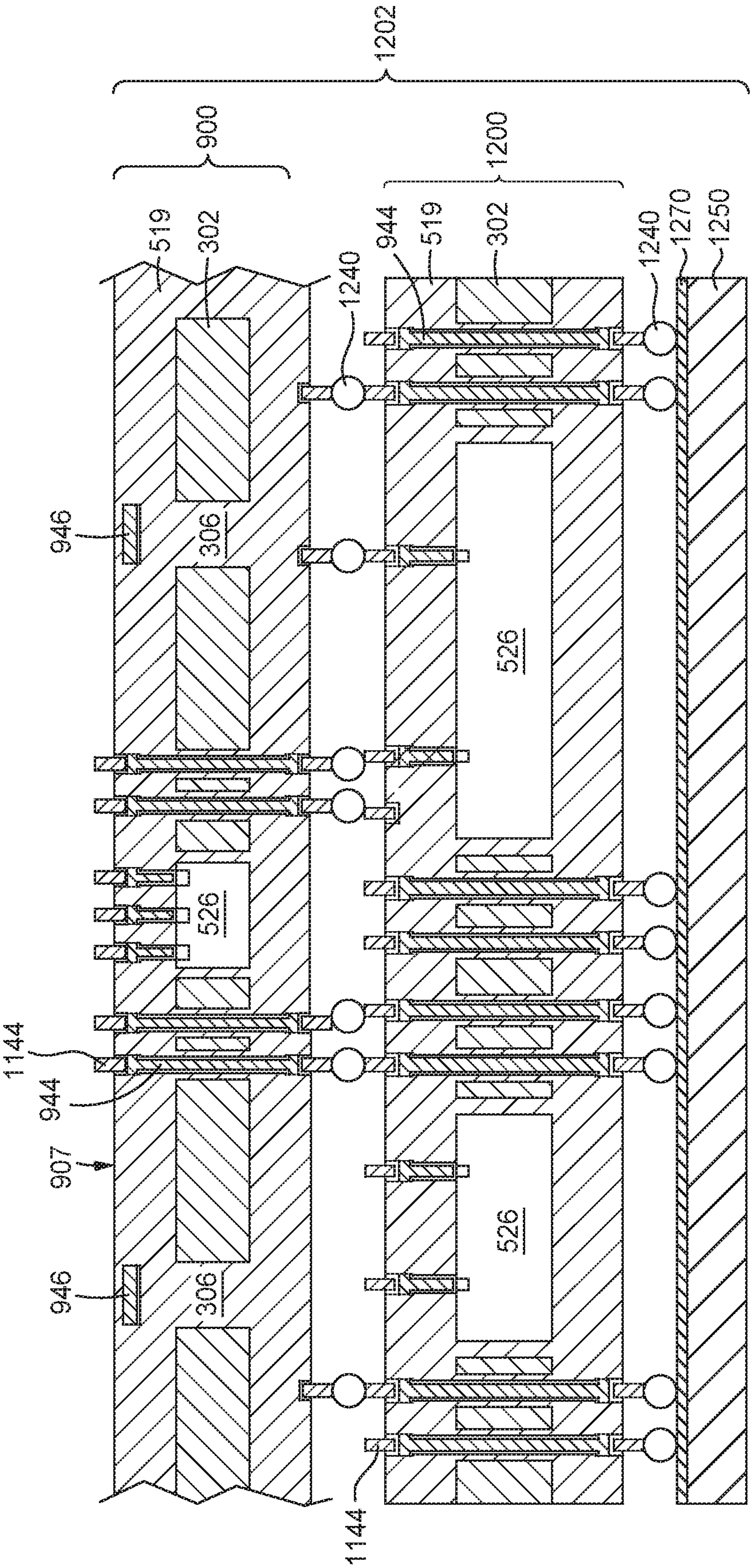
FIG. 12 schematically illustrates a cross-sectional view of a reconstituted substrate in a 3D stacked assembly, according to embodiments described herein.

At operation 1022 and depicted in FIG. 11K, one or more functional 2D packages 1100 having embedded RF elements 946 may be singulated from the 2D reconstituted substrate 900. (Although described as a package, the packages 1100 may also refer to SiPs and other functional packaged devices.) In some embodiments, however, additional redistribution layers may be formed on the reconstituted substrate 900 prior to singulation of packages 1100 by utilizing the sequences and processes described above. For example, one or more additional redistribution layers 1160 may be formed on a side or surface of the reconstituted substrate 900 opposite of the first redistribution layer 1258, such as the major surface 1007, as depicted in FIG. 11L. Alternatively, one or more additional redistribution layers 1160 may be formed on the same side or surface of the first redistribution layer 1158, such as major surface 907. The packages 1100 may then be singulated from the reconstituted substrate 900 after all desired redistribution layers are formed. Each package 1100 may thereafter be integrated with other semiconductor devices and packages in the desired 2D and 3D arrangements and architectures, which may be heterogeneous or homogeneous. For example, the packages 1100 may be vertically stacked with other semiconductor devices and systems to form heterogeneous 3D stacked systems. In yet other embodiments, however, the reconstituted substrate 900 having one or more redistribution layers 1158, 1160 formed thereon may be 3D integrated with additional semiconductor devices and systems prior to singulation into individual 3D packages or SiPs, which may be heterogeneous or homogeneous.

As described above, the devices and methods described herein may be utilized in any suitable 2D or 3D integration application, including stacked PCB and/or stacked package assemblies. In one exemplary embodiment depicted in FIG. 12, a reconstituted substrate 900 having a plurality of RF elements 946 and semiconductor dies 526 embedded therein is stacked with another reconstituted substrate 1200 and a PCB 1250 to form a stacked 3D structure 1202. The integration of the reconstituted substrate 900 in the stacked structure 1202 provides multiple advantages over conventional stacked structures for RF devices. Such benefits include a thin form factor and a high die-to-package volume ratio, which enables greater I/O scaling to meet the ever-increasing bandwidth and power efficiency demands of high performance computing (HPC) and wireless devices. The utilization of a structured silicon frame for the reconstituted substrate 900 also provides optimal material stiffness and thermal conductivity for improved electrical performance, thermal management, and flexibility for 3D integrated circuit (3D IC) architecture.

In some embodiments, the PCB 1250 is formed of a suitable dielectric material such as glass fiber reinforced epoxy resin (e.g., FR-1, FR-2, FR-4, halogen-free FR-4, high $T_g$ FR-4, and FR-5). Other examples of suitable dielectric materials include resin copper-clad (RCC), polyimide, polytetrafluoroethylene (PTFE), CEM-3, and the like. The PCB 1250 may be a single-sided or double-sided circuit boards. In some embodiments, the PCB 1250 includes an electrical distribution layer 1270 formed thereon and conductively connected with interconnections 944 of the reconstituted substrate 1200 and/or the reconstituted substrate 900. The electrical distribution layer 1270 is formed of any suitable conductive material such as copper, tungsten, aluminum, silver, gold, or any other suitable materials or combinations thereof, and has a thickness between about 40 μm and about 100 μm, such as a thickness between about 60 μm and about 80 μm. For example, the electrical distribution layer 1270 has a thickness of about 70 μm. Furthermore, although a single electrical distribution layers 1270 is depicted, the PCB 1250 and or the reconstituted substrates 900, 1200 may have more or fewer electrical distribution layers formed on surfaces thereof. In other embodiments, the PCB 1250 includes conductive pads or other suitable electrical contacts for interconnection with the reconstituted substrates 900, 1200.

The reconstituted substrate 1200 is substantially similar to the reconstituted substrate 900, and includes a substrate 302, insulating layer 519, embedded dies 526, interconnections 944, and redistribution connections 1144. In some embodiments, the reconstituted substrate 1200 may further include one or more embedded RF elements 946.

The PCB 1250 and the reconstituted substrates 900, 1200 are directly or indirectly conductively by one or more solder bumps 1240 disposed between the electrical contacts of the PCB 1250 (e.g., electrical distribution layer 1270) and the interconnections 944 and redistribution connections 1144 of the reconstituted substrates 900, 1200. In one embodiment, the solder bumps 1240 are formed of a substantially similar material to that of the interconnections 944, redistribution connections 1144, and/or the electrical distribution layer 1270. For example, the solder bumps 1240 are formed of a conductive material such as copper, tungsten, aluminum, silver, gold, or any other suitable materials or combinations thereof. In other examples, the solder bumps 1240 are formed of a solder alloy such as Sn—Pb, Sn—Ag, Sn—Cu, or any other suitable materials or combinations thereof. In one embodiment, the solder bumps 1240 include C4 (controlled collapse chip connection) bumps. In one embodiment, the solder bumps 1240 include C2 (chip connection, such as a Cu-pillar with a solder cap) bumps. Utilization of C2 solder bumps enables a smaller pitch between interconnections and improved thermal and/or electrical properties for the stacked structure 1202. In some embodiments, the solder bumps 1240 have a diameter between about 10 μm and about 150 μm, such as a diameter between about 50 μm and about 100 μm. The solder bumps 1240 may further be formed by any suitable wafer bumping processes, including but not limited to electrochemical deposition (ECD) and electroplating.

The utilization of solder bumps 1240 to bridge interconnections 944, redistributions connections 1144, and/or the electrical distribution layer 1270 creates spaces (e.g., distances) between the reconstituted substrate 900, 1200 and/or the PCB 1250. In some embodiments, these spaces are filled with an encapsulation material (not shown) to enhance the reliability of the solder bumps 1240 disposed therein. The encapsulation material is any suitable type of encapsulant or underfill and substantially surrounds the solder bumps 1240. In one example, the encapsulation material includes a pre-assembly underfill material, such as a no-flow underfill (NUF) material, a nonconductive paste (NCP) material, and a nonconductive film (NCF) material. In one example, the encapsulation material includes a post-assembly underfill material, such as a capillary underfill (CUF) material and a molded underfill (MUF) material. In one embodiment, the encapsulation material includes a low-expansion-filler-containing resin, such as an epoxy resin filled with (e.g., containing) $SiO_2$, AlN, $Al_2O_3$, SiC, $Si_3N_4$, $Sr_2Ce_2Ti_5O_{16}$, $ZrSiO_4$, $CaSiO_3$, BeO, $CeO_2$, BN, $CaCu_3Ti_4O_{12}$, MgO, $TiO_2$, ZnO and the like.

Although shown in one exemplary arrangement, the reconstituted substrate 900 may be integrated into any desired 2D or 3D arrangements having one or more of the systems and/or devices shown.

In sum, the embodiments described herein advantageously provide improved methods of reconstituted substrate formation for fabricating advanced integrated semiconductor devices for high frequency applications. By utilizing the methods described above, high aspect ratio RF features may be formed on glass and/or silicon substrates while maintaining high radiation efficiency and optimal bandwidth, thus enabling the economical formation of thinner and narrower reconstituted substrates for 2D and 3D integration. The thin and small-form-factor reconstituted substrates and reconstituted substrate stacks described herein provide the benefits of not only increased RF radiation efficiency, high I/O density, and improved bandwidth and power, but also more economical manufacturing with dual-sided metallization and high production yield by eliminating single-die flip-chip attachment, wire bonding, and over-molding steps, which are prone to feature damage in high-volume manufacturing of integrated semiconductor devices.

While the foregoing is directed to embodiments of the present disclosure, other and further embodiments of the disclosure may be devised without departing from the basic scope thereof, and the scope thereof is determined by the claims that follow.

What is claimed is:

1. A package assembly, comprising:

a frame having a first surface opposite a second surface, the frame further comprising:

a frame material that comprises silicon;

at least one first cavity with a semiconductor die disposed therein;

one or more second cavities; and a via comprising a via surface that defines an opening extending through the frame from the first surface to the second surface;

an insulating layer disposed over the first surface and the second surface, the insulating layer contacting at least a portion of each side of the semiconductor die;

a radio frequency element disposed over a portion of the insulating layer that is adjacent to one of the one or more second cavities; and an electrical interconnection disposed within the via, wherein the insulating layer is disposed between the via surface and the electrical interconnection.

2. The package assembly of claim 1, wherein the frame has a thickness between about 60 μm and about 160 μm.

3. The package assembly of claim 1, wherein the at least one cavity has lateral dimensions between about 3 mm and about 50 mm.

4. The package assembly of claim 3, wherein the lateral dimensions of the at least one cavity are greater than lateral dimensions of the semiconductor die by less than about 150 μm.

5. The package assembly of claim 1, wherein the via has a diameter between about 20 μm and about 200 μm.

6. The package assembly of claim 1, wherein the insulating layer comprises an epoxy resin.

7. The package assembly of claim 6, wherein the epoxy resin comprises ceramic particles.

8. The package assembly of claim 6, wherein the ceramic particles comprise silica particles.

9. The package assembly of claim 6, wherein the insulating layer has a thickness between about 5 μm and about 50 μm between the electrical interconnection and the semiconductor die.

10. The package assembly of claim 1, further comprising an adhesion layer or a seed layer disposed between the electrical interconnection and the insulating layer.

11. The package assembly of claim 10, wherein the adhesion layer comprises molybdenum and the seed layer comprises copper.

12. The package assembly of claim 1, wherein the radio frequency element comprises an antenna, a conductor, or an inductor.

13. The package assembly of claim 12, wherein the semiconductor die is a radio frequency chip.

14. A package assembly, comprising:

a frame comprising silicon and having one or more cavities formed there in;

an oxide layer disposed over surfaces of the frame;

an insulating layer formed on the oxide layer and filling at least one of the one or more cavities, the insulating layer comprising an epoxy resin material having ceramic particles disposed therein;

one or more radio frequency elements formed over the filled at least one of the one or more cavities; and one or more metal interconnections disposed within a portion of package assembly.

15. The package assembly of claim 14, wherein the frame comprises a monocrystalline solar substrate.

16. The package assembly of claim 15, wherein the frame has a thickness between about 60 μm and about 160 μm.

17. The package assembly of claim 14, wherein the frame further comprises:

one or more semiconductor dies disposed within at least one of the one or more cavities; and one or more vias formed therein, wherein the one or more metal interconnections are disposed through the one or more vias.

18. The package assembly of claim 14, wherein the one or more radio frequency elements comprise an antenna, a conductor, or an inductor.

19. A package assembly, comprising:

a frame comprising silicon and having a first surface opposite a second surface, the frame further comprising:

one or more first cavities having semiconductor dies disposed therein;

one or more second cavities; and one or more vias comprising via surfaces defining openings extending through the frame from the first surface to the second surface;

a first insulating layer formed on the frame, the first insulating layer comprising an epoxy resin material comprising ceramic particles, the first insulating layer being disposed within each of the one or more second cavities;

one or more radio frequency elements formed over the first insulating layer, each of the one or more radio frequency elements aligned with one of the one or more second cavities;

one or more electrical interconnections disposed through the frame or the first insulating layer; and a redistribution layer formed on the embedded die assembly, the redistribution layer comprising:

a second insulating layer formed on the first insulating layer the second insulating embedding the one or more radio frequency elements within the package assembly; and one or more electrical redistribution connections disposed through the second insulating layer.

20. The package assembly of claim 19, wherein the second insulating layer is formed of the same material as the first insulating layer.

* * * * *